(12) United States Patent
Bae et al.

(10) Patent No.: US 10,943,908 B2
(45) Date of Patent: Mar. 9, 2021

(54) METHOD OF FORMING SEMICONDUCTOR DEVICE

(71) Applicant: SAMSUNG ELECTRONICS CO., LTD., Suwon-si (KR)

(72) Inventors: Jin Woo Bae, Yongin-si (KR); Su Young Shin, Hwaseong-si (KR); Young Ho Koh, Seongnam-si (KR); Bo Un Yoon, Seoul (KR); Il Young Yoon, Hwaseong-si (KR); Yang Hee Lee, Incheon (KR); Hee Sook Cheon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 50 days.

(21) Appl. No.: 16/411,613

(22) Filed: May 14, 2019

(65) Prior Publication Data
US 2020/0098763 A1   Mar. 26, 2020

(30) Foreign Application Priority Data
Sep. 21, 2018   (KR) .................. 10-2018-0113699

(51) Int. Cl.
*H01L 21/033*   (2006.01)
*H01L 27/108*   (2006.01)
*H01L 21/311*   (2006.01)
*H01L 21/321*   (2006.01)
*H01L 21/3213*   (2006.01)
(Continued)

(52) U.S. Cl.
CPC .... *H01L 27/10852* (2013.01); *H01L 21/0337* (2013.01); *H01L 21/28556* (2013.01);
(Continued)

(58) Field of Classification Search
CPC ......... H01L 21/31144; H01L 21/28556; H01L 27/10894; H01L 28/90; H01L 21/3212;
(Continued)

(56) References Cited

U.S. PATENT DOCUMENTS 7,829,410 B2   11/2010   Plum
8,580,648 B2   11/2013   Choi et al.
(Continued)

FOREIGN PATENT DOCUMENTS

JP            4446179        1/2010
KR   10-2006-0004508        1/2006
(Continued)

*Primary Examiner* — Thanh T Nguyen
(74) *Attorney, Agent, or Firm* — F. Chau & Associates, LLC

(57) ABSTRACT

A method of forming a semiconductor device includes forming a mold structure on a substrate, forming a first mask layer having a deposition thickness on the mold structure and patterning the first mask layer to form first mask openings which expose the mold structure. The mold structure is etched to form holes that penetrate the mold structure. The first mask layer is thinned to form mask portions having thickness smaller than the deposition thickness. Conductive patterns are formed to fill the holes and the first mask openings. The first mask layer including the mask portions is etched to expose the mold structure. The conductive patterns include protrusions. A chemical mechanical polishing process is performed to remove the protrusions of the conductive patterns.

16 Claims, 21 Drawing Sheets

(51) Int. Cl.
*H01L 21/285* (2006.01)
*H01L 49/02* (2006.01)
*H01L 21/02* (2006.01)

(52) U.S. Cl.
CPC .... *H01L 21/31144* (2013.01); *H01L 21/3212* (2013.01); *H01L 21/32139* (2013.01); *H01L 28/90* (2013.01); *H01L 21/0217* (2013.01); *H01L 21/02167* (2013.01); *H01L 21/0332* (2013.01)

(58) Field of Classification Search
CPC ......... H01L 21/32139; H01L 27/10852; H01L 21/0332; H01L 21/0217; H01L 21/02167
See application file for complete search history.

(56) References Cited

U.S. PATENT DOCUMENTS

| | | | |
|---|---|---|---|
| 9,318,495 B2 | 4/2016 | Kang | |
| 9,496,266 B2 | 11/2016 | Kim et al. | |
| 9,673,272 B2* | 6/2017 | Choi | H01L 28/90 |
| 2006/0186449 A1 | 8/2006 | Uchiyama | |
| 2013/0115748 A1 | 5/2013 | Kim | |
| 2013/0147048 A1* | 6/2013 | Kuh | H01L 27/10814 |
| | | | 257/768 |
| 2014/0065785 A1* | 3/2014 | Yoon | H01L 28/56 |
| | | | 438/381 |
| 2014/0268616 A1 | 9/2014 | Lan et al. | |
| 2014/0374880 A1 | 12/2014 | Chen et al. | |
| 2017/0077102 A1* | 3/2017 | Kim | H01L 27/10855 |
| 2019/0198506 A1* | 6/2019 | Kim | H01L 27/10876 |

FOREIGN PATENT DOCUMENTS

| | | |
|---|---|---|
| KR | 10-2012-0020948 | 3/2012 |
| KR | 10-2013-0049393 | 5/2013 |
| KR | 10-2015-0000832 | 1/2015 |
| KR | 10-2015-0130516 | 11/2015 |
| KR | 10-1583516 | 1/2016 |

\* cited by examiner

METHOD OF FORMING SEMICONDUCTOR DEVICE

CROSS-REFERENCE TO RELATED APPLICATION(S)

This application claims priority under 35 U.S.C. § 119 to Korean Patent Application No. 10-2018-0113699 filed on Sep. 21, 2018 in the Korean Intellectual Property Office (KIPO), the disclosure of which is incorporated by reference in its entirety herein.

1. TECHNICAL FIELD

The present inventive concept relates to a method of forming a semiconductor device, and more particularly, to a method of forming a semiconductor device using chemical mechanical polishing (CMP) and a semiconductor device formed by the method.

2. DISCUSSION OF RELATED ART

Research has been performed concerning decreasing the sizes of components constituting a semiconductor device and to improve the performance thereof. Furthermore, research has been performed to reliably and stably form scaled-down cell capacitors in a dynamic random access memory (DRAM).

SUMMARY

An aspect of an exemplary embodiment of the present inventive concept is to provide a method of forming a semiconductor device, including forming first electrodes of cell capacitors of a DRAM.

Another aspect of an exemplary embodiment of the present inventive concept is to provide a semiconductor device including first electrodes.

According to an exemplary embodiment of the present inventive concept, a method of forming a semiconductor device includes forming a mold structure on a substrate. A first mask layer is formed having a deposition thickness on the mold structure. The first mask layer is patterned to form first mask openings that expose the mold structure. The mold structure exposed by the first mask openings is etched to form holes that penetrate the mold structure. The first mask layer is thinned to form mask portions having thickness smaller than the deposition thickness. Conductive patterns that fill the holes and the first mask openings are formed. The first mask layer including the mask portions is etched to expose the mold structure. The conductive patterns include protrusions. A chemical mechanical polishing process is performed to remove the protrusions of the conductive patterns.

According to another exemplary embodiment, a method of forming a semiconductor device includes forming a mold structure on a substrate. A mask layer is formed on the mold structure. The mask layer has mask openings to expose the mold structure. The mold structure is etched to form holes therein. A conductive material layer is formed to fill the holes and the mask openings and to cover the mask layer. The conductive material layer is etched to form conductive patterns in the holes and the mask openings. The mask layer is etched to expose side surfaces of protrusions of the conductive patterns. A chemical mechanical polishing process is performed to remove the protrusions of the conductive patterns.

According to another exemplary embodiment, a method of forming a semiconductor device includes forming a mold structure including at least one mold layer and at least one support layer. A first support layer is disposed on an uppermost portion of the mold structure. A mask layer is formed having mask openings on the mold structure. The mask openings expose the mold structure. The mold structure exposed by the mask openings is etched to form holes that penetrate the mold structure. The mask layer is formed to include a first mask portion having a first thickness and a second mask portion having a second thickness that is greater than the first thickness. The mask openings remain in the first mask portion after the etching is performed. Conductive patterns are formed in the holes and the mask openings, the conductive patterns include protrusions. The mask layer is etched to expose the conductive patterns including protrusions. A chemical mechanical polishing process is performed to remove the protrusions of the conductive patterns. The mold structure is patterned. The at least one support layer is patterned to be formed as at least one support patterns having opening. The at least one mold layer is removed to expose side surfaces of the conductive patterns. A dielectric layer is formed on the at least one support patterns and the conductive patterns. An electrode layer is formed on the dielectric layer.

According to another exemplary embodiment, a semiconductor device includes first electrodes disposed on a substrate. An upper support pattern connects upper regions of the first electrodes, the upper support pattern having upper openings. A dielectric layer is disposed to cover surfaces of the upper support pattern and the first electrodes. A second electrode is disposed on the dielectric layer. The first electrodes have upper surfaces coplanar with an upper surface of the upper support pattern. The first electrodes have inclined side surfaces in the upper openings.

BRIEF DESCRIPTION OF DRAWINGS

The above and other aspects, features, and advantages of the present disclosure will be more clearly understood from the following detailed description of exemplary embodiments, taken in conjunction with the accompanying drawings, in which:

FIGS. 3 to 9A and FIG. 10B to 13 are cross-sectional views of the semiconductor device taken along line I-I' of FIG. 2 according to exemplary embodiments of the present inventive concept;

DETAILED DESCRIPTION OF THE EXEMPLARY EMBODIMENTS

Hereinafter, exemplary embodiments of the present inventive concept will be described with reference to the accompanying drawings.

Figure 1:
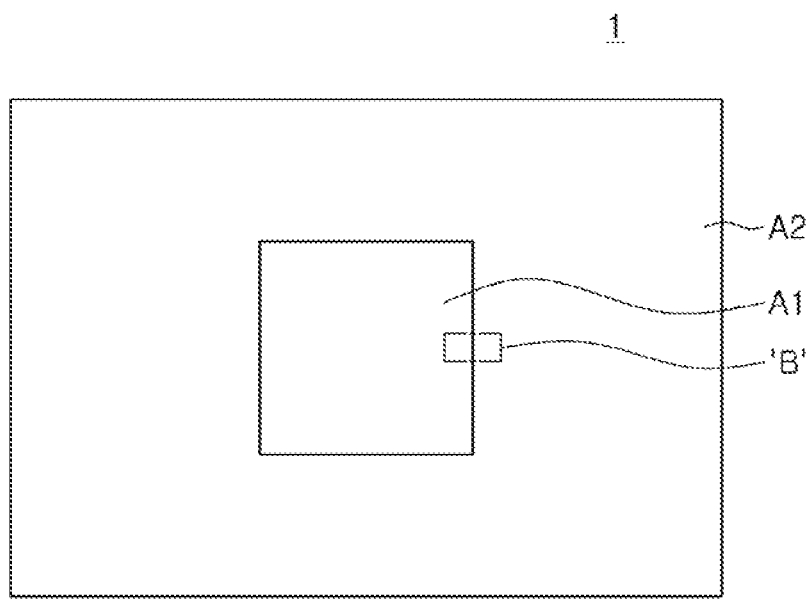
FIG. 1 is a plan view of a semiconductor device according to an exemplary embodiment of the present inventive concept.
Figure 2:
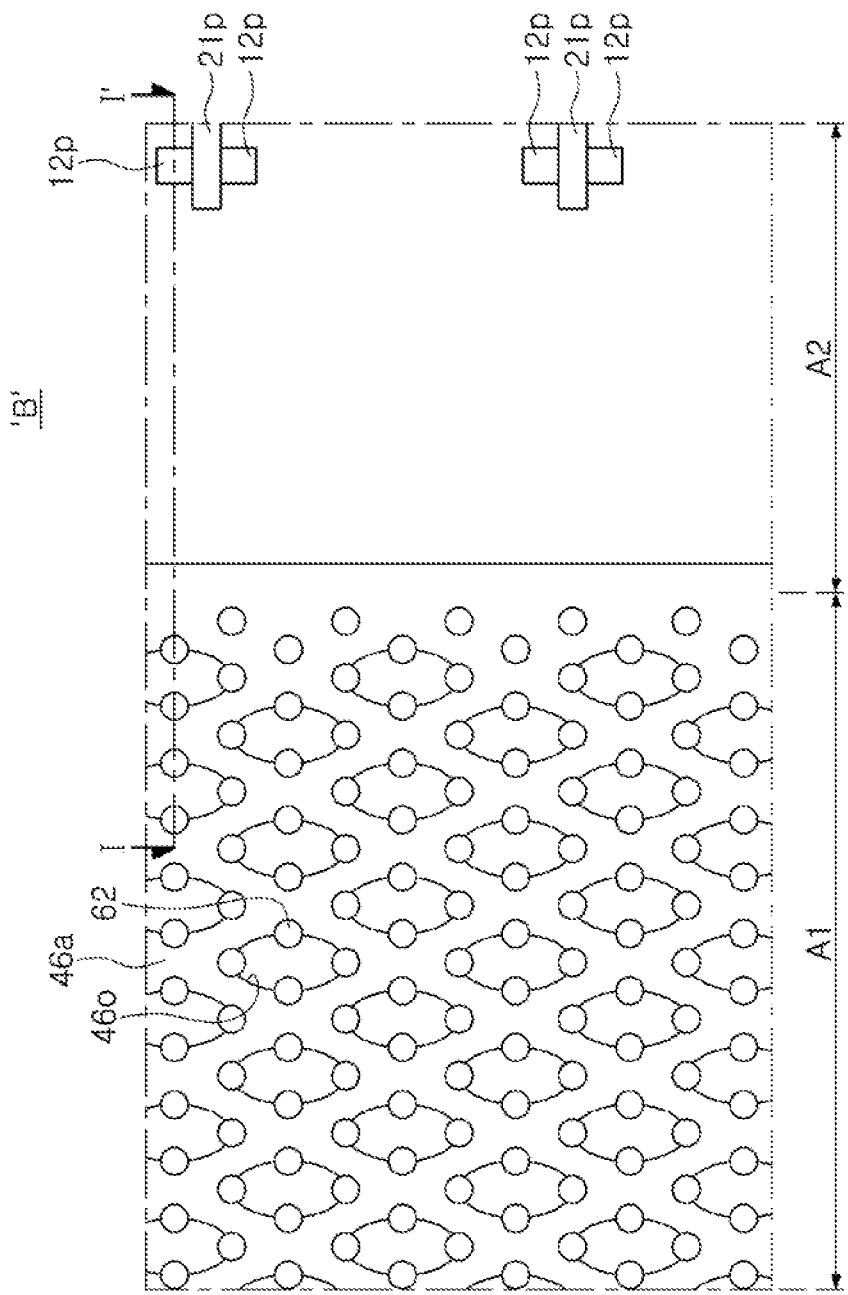
FIG. 2 is a partial enlarged view of portion 'B' of the semiconductor device in FIG. 1 according to an exemplary embodiment of the present inventive concept.
Figure 3:
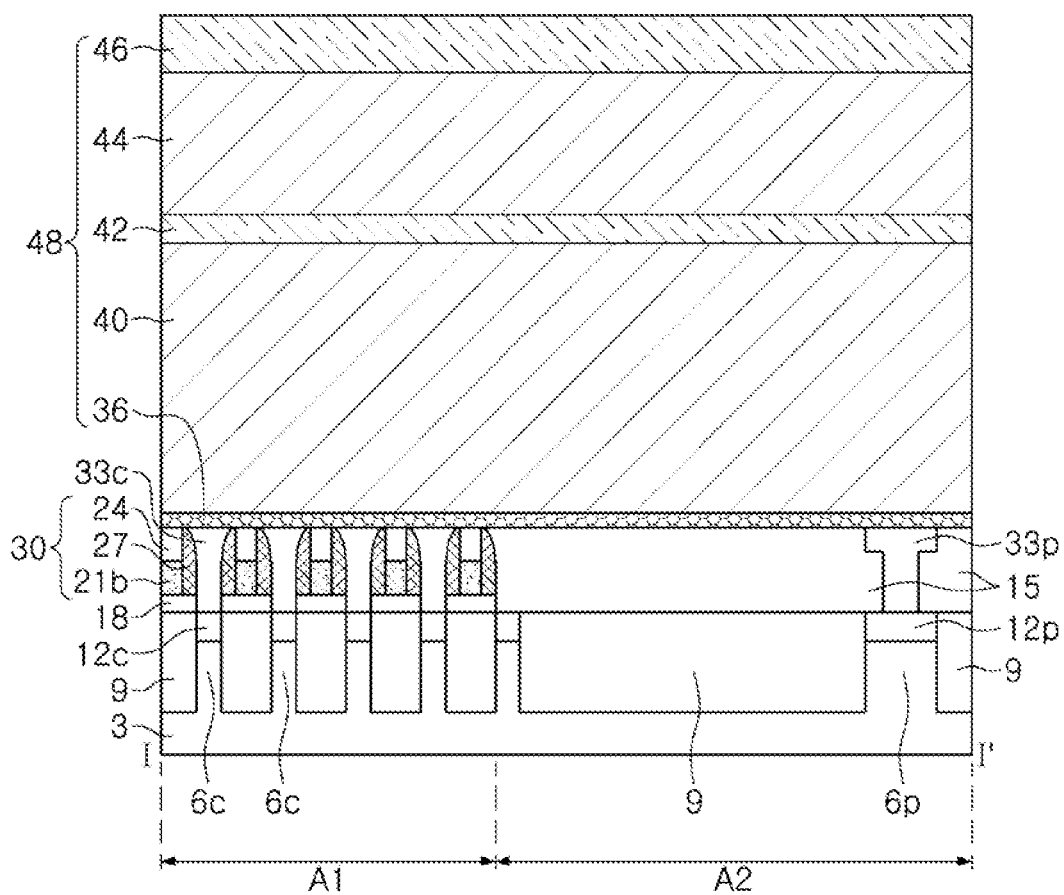

Referring to FIGS. 1, 2, and 3, an isolation region may be formed on a substrate 3 including a first region A1 and a second region A2 to define cell active regions 6c and a peripheral active region 6p. The substrate 3 may be a semiconductor substrate.

In exemplary embodiments, the first region A1 may be a memory cell array region of a memory device such as a DRAM or the like, and the second region A2 may be a peripheral circuit region A2 disposed at a periphery of the first region A1, which may be the memory cell array region.

Bitline structures 30 may be firmed on the first region A1 of the substrate 3. The forming of bitline structures 30 may include the forming of bitlines 21b and a bitline capping layer 24, stacked sequentially. The forming of bitline structures may further include forming bitline spacers 27 on side surfaces of the bitlines 21b and the bitline capping layer 24. As shown in FIG. 2, gate electrodes 21p may be formed on the second region A2 of the substrate 3. In one exemplary embodiment, the gate electrodes may be formed simultaneously with the formation of the bitlines 21b. The bitlines 21b and the gate electrodes 21p may be formed of a conductive material.

The bitlines 21b may be formed on an insulating layer 18 on the substrate 3. The bitline capping layer 24 may be formed of an insulating material such as a silicon nitride or the like. The bitline spacers 27 may be thrilled of an insulating material such as a silicon nitride or the like. An interlayer dielectric 15 may be formed on the second region A2 of the substrate 3. The interlayer dielectric 15 may be formed of a silicon nitride. Cell contact plugs 33c may be formed between the bitline structures 30 to be electrically connected to cell impurity regions 12c in the cell active regions 6c. A peripheral contact plug 33p may be formed to penetrate the interlayer dielectric 15 and to be electrically connected to the peripheral impurity region 12p in the peripheral active region 6p.

The first impurity regions 12c may be either one of a source and a drain of a cell switching element formed in the first region A1. The second impurity region 12p may be a source/drain of a peripheral transistor formed in the second region A2.

As shown in FIG. 3, a mold structure 48 may be formed on a substrate including the cell contact plugs 33c and the peripheral contact plug 33p. The mold structure 48 may be configured to cover the bitline structures 30, the cell contact plugs 33c, the interlayer dielectric 15, and the peripheral contact plug 33p.

The mold structure 48 may include a single or a plurality of mold layers and a single or a plurality of support layers. The single or a plurality of mold layers may be referred to as at least one mold layer, and the single or a plurality of support layers may be referred to as at least one support layer. In the mold structure 48, among the single or the plurality of mold layers and the single or the plurality of support layers, an uppermost layer may be a support layer. For example, the mold structure 48 may include an etch stop layer 36, a lower mold layer 40 disposed on the etch stop layer 36, a lower support layer 42 disposed on the lower mold layer 40, an upper mold layer 44 disposed on the lower support layer 42, and an upper support layer 46 disposed on the upper mold layer 44.

In one exemplary embodiment, the lower and upper mold layers 40 and 44 may be formed of a silicon oxide. In one exemplary embodiment, the lower and upper support layers 42 and 46 may be formed of an insulating material having an etch selectivity with respect to the lower and upper mold layers 40 and 44. For example, the lower and upper support layers 42 and 46 may be formed of silicon nitride (SiN) or silicon carbon nitride (SiCN). The etch stop layer 36 may be formed of an insulating material, having an etch selectivity with respect to the lower mold layer 40, such as SiN or SiCN.

In exemplary embodiments, the upper support layer 46 may be referred to as a first support layer, the upper mold layer 44 may be referred to as a first mold layer, the lower support layer 42 may be referred to as a second support layer, and the lower mold layer 40 may be referred to as a second mold layer.

Figure 4:
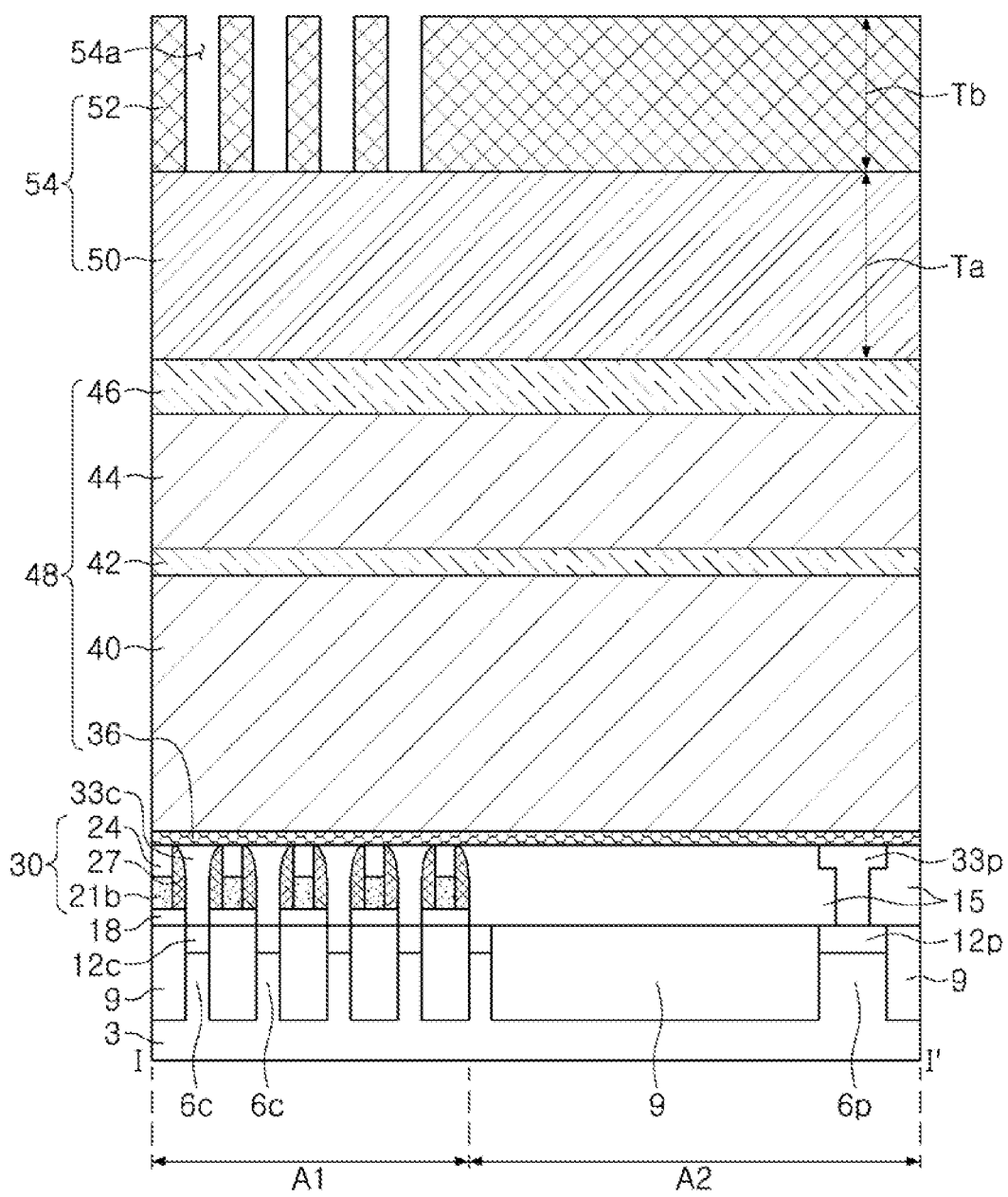
Figure 5:
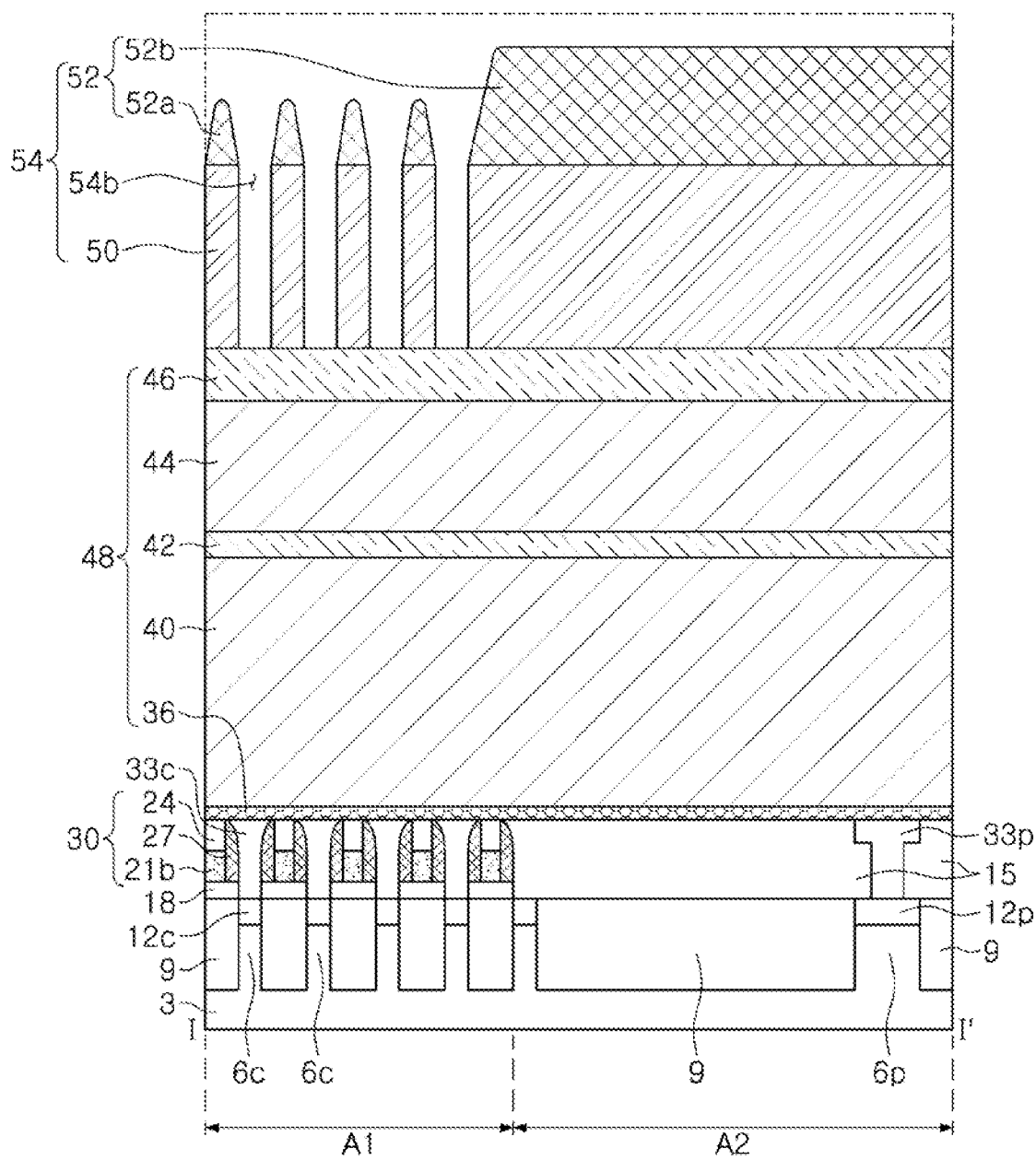

Referring to FIGS. 4-5, a mask structure 54 may be formed on the mold structure 48.

The forming of a mask structure 54 may include forming a first mask layer 50 on the mold structure 48 to have a deposition thickness Ta and a second mask layer 52 on the first mask layer 50 having a deposition thickness Tb.

The first mask layer 50 may be a mask layer to pattern the mold structure 48. The mask layer 50 may be formed of polysilicon. The second mask layer 52 may be a mask to pattern the first mask layer 50. The second mask layer 52 may be formed of silicon oxide or spin-on-hardmask (SOH). The above-mentioned materials for forming the first and second mask layers 50 and 52 are exemplary materials, and the present inventive concept is not limited thereto. In other exemplary embodiments, the above-mentioned materials for forming the first and second mask layers 50 and 52 may be replaced with other materials.

In certain exemplary embodiments, the deposition thickness Ta of the first mask layer 50 may be greater than the deposition thickness Tb of the second mask layer 52. The second mask layer 52 may have openings to expose the first mask layer 50 on the first region A1. For example, the openings may be second mask openings 54a.

Referring to FIGS. 1, 2, 4 and 5, the first mask layer 50 exposed by the second mask openings 54a may be etched by an etching process using the second mask layer 52 as an etching mask in such a manner that first mask openings 54b are formed to penetrate the first mask layer 50 and to expose the mold structure 48.

While the first mask layer 50 may be etched to form the first mask openings 54b, the second mask layer 52 may decrease in thickness. The second mask layer 52 has a portion 52b disposed on the second region A2 and a portion 52a disposed on the first region A1. The portion 52a may have a thickness that is less than a thickness of the portion 52b.

In an exemplary embodiment, the portion 52a of the second mask layer 52 disposed on the first region A1 may be formed to have a shape in which a width thereof is decreased toward an upper direction.

Figure 6:
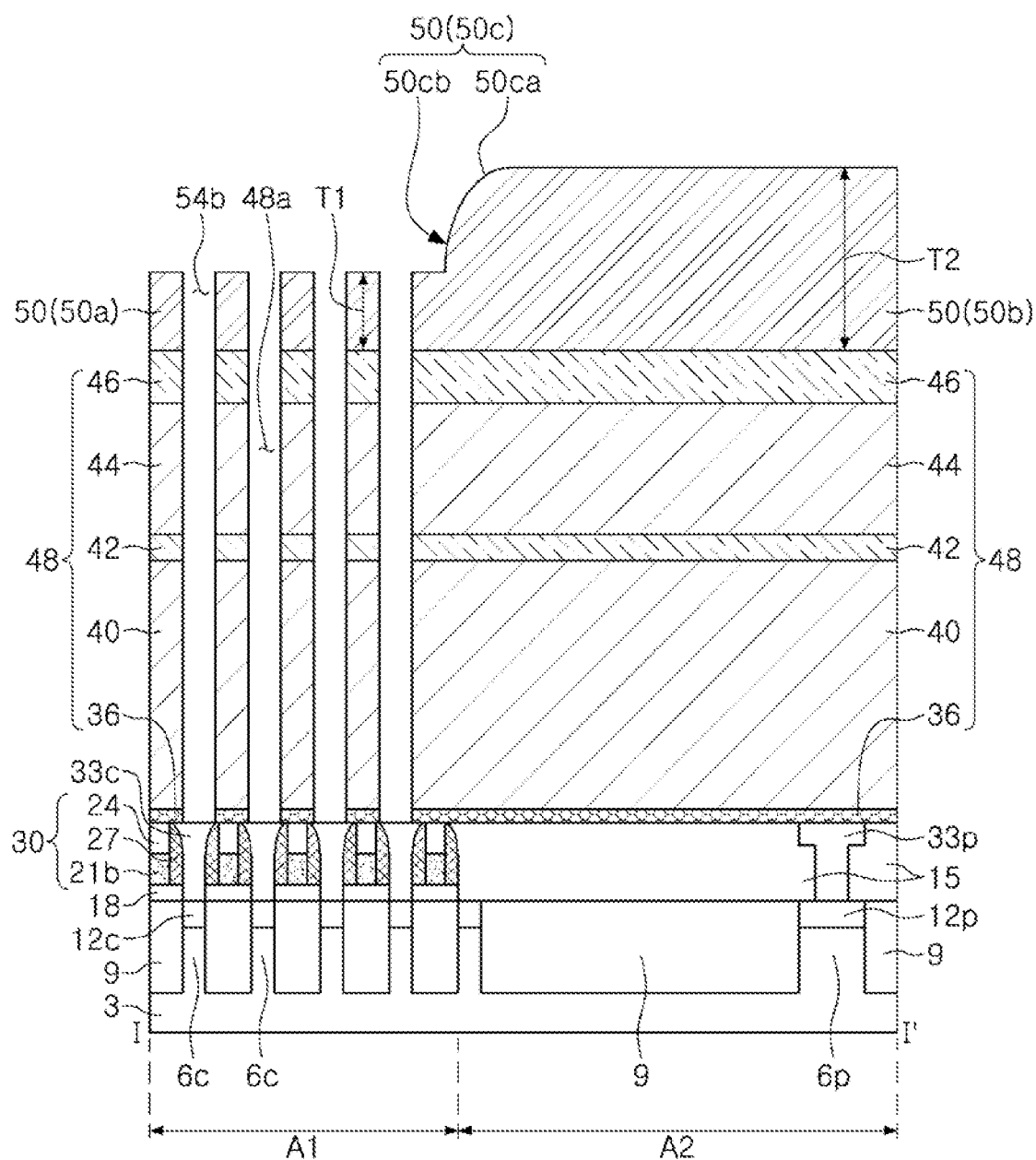

Referring to FIGS. 1, 2, and 6, the mold structure 48 exposed by the first mask openings 54b may be etched using the first mask layer 50 as an etching mask in such a manner that holes 48a are formed to expose the cell contact plugs 33c.

A thickness of the first mask layer 50 may be reduced to be less than the deposition thickness Ta while forming the holes 48a. In an exemplary embodiment, the second mask layer (52 in FIG. 5) may be removed before the thickness of the first mask layer 50 is reduced to be less than the deposition thickness Ta. The first mask layer 50 may be formed on the first region A1 to have a first thickness T1 and on the second region A2 to have a second thickness T2 greater than the first thickness T1. Each of the first and second thicknesses T1 and T2 of the first mask layer 50 after formation of the holes 48a may be less than the deposition thickness (Ta in FIG. 4) of the first mask layer 50 before formation of the holes 48a.

As shown in FIG. 6, the first mask layer 50 may include a first mask portion 50a formed on the first region A1 to have, the first thickness T1 and a second mask portion 50b formed on the second region A2 to have the second thickness T2.

The first mask layer 50 may include an inclined portion 50c between the first mask portion 50a having the first thickness T1 and the second mask portion 50b having the second thickness T2.

The inclined portion 50c of the first mask layer 50 may include a first inclined portion 50ca and a second inclined portion 50cb. The second inclined portion 50cb may have a slope that is greater (e.g., steeper) than a slope of the first inclined portion 50ca.

The first inclined portion 50ca may be disposed adjacent to the second mask portion 50b, and the second inclined portion 50cb may be disposed adjacent to the first mask portion 50a. Accordingly, in an exemplary embodiment, the first inclined portion 50ca and the second inclined portion 50cb may be sequentially disposed in a direction from the second mask portion 50b toward the first mask portion 50a.

The above-mentioned first mask openings 54b may remain to penetrate the first mask portion 50a, having the first thickness T1 of the first mask layer 50.

Figure 7:
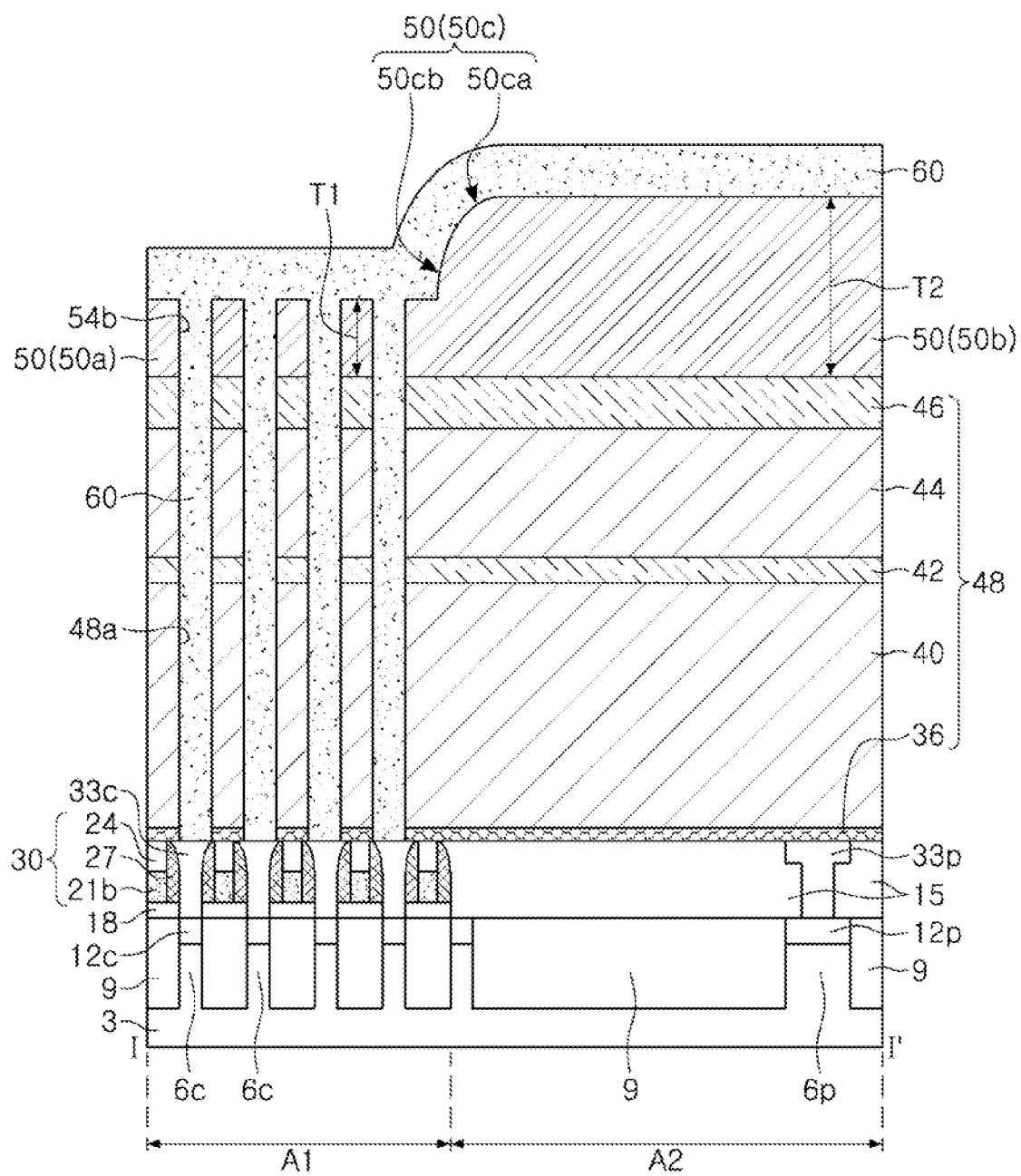

Referring to FIGS. 1, 2, and 7, a conductive material layer 60 may be formed to fill the holes 48a of the mold structure 48 and the first mask openings 54b of the first mask layer 50 and to cover the first mask layer 50. The conductive material layer 60 may include a conductive material such as a metal, a metal nitride, a metal oxide, a metal silicide, conductive carbon, and combinations thereof. For example, in exemplary embodiments, the conductive material 60 may include titanium (Ti), titanium nitride (TiN), titanium aluminum nitride (TiAlN), titanium carbon nitride (TiCN), tantalum (Ta), tantalum nitride (TaN), tantalum aluminum nitride (TaAlN), tantalum carbon nitride (TaCN), ruthenium (Ru), platinum (Pt) or combinations thereof.

Figure 8:
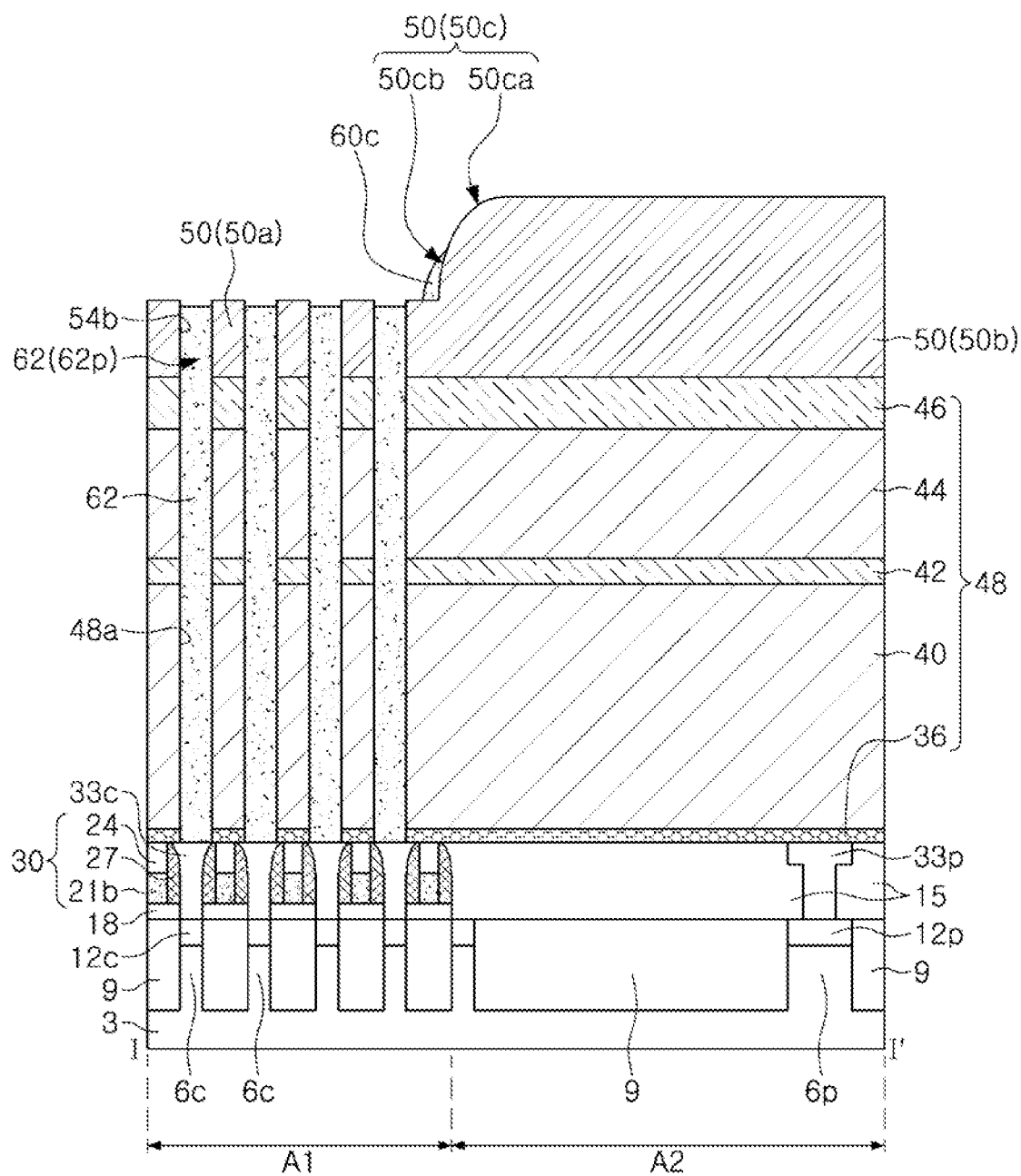

Referring to FIGS. 1, 2, and 8, the conductive material layer 60 may be etched to form conductive patterns 62 remaining in the holes 48a and the first mask openings 54b. Portions of the conductive patterns 62 remaining in the first mask openings 54b may be referred to as protrusions 62p.

In an exemplary embodiment, the conductive material layer 60 may be etched to form the conductive patterns 62 while a portion of the conductive material layer 60 may remain as a dummy pattern 60c in contact with the second inclined portion 50cb of the inclined portion 50c.

Figure 9A:
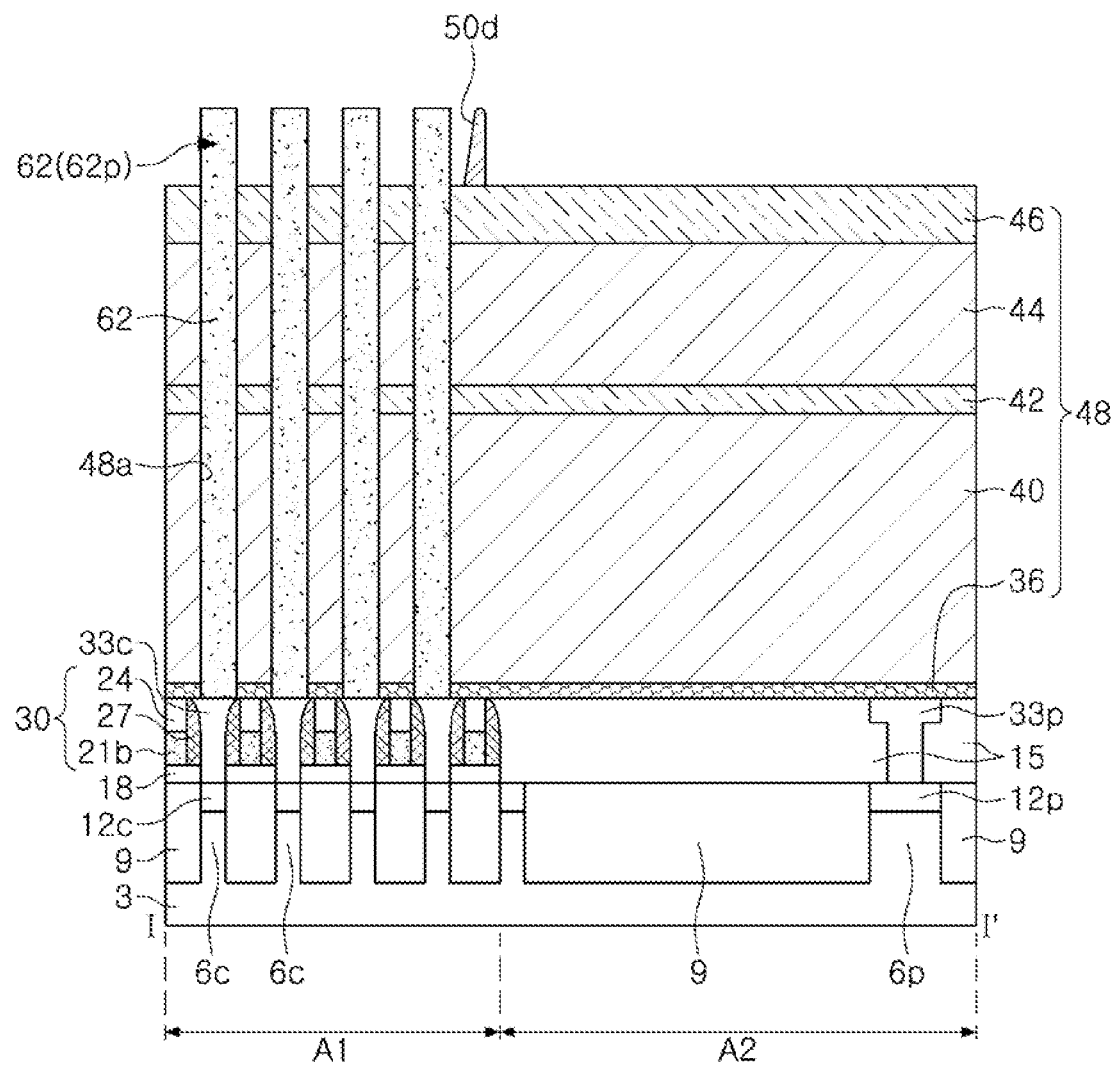

Referring to FIGS. 1, 2, and 9A, the first mask layer (50 in FIG. 8) may be etched to expose side surfaces of the protrusions 62p of the conductive patterns 62. A portion of the first mask layer 50 disposed below the dummy pattern (60c in FIG. 8) may remain to form a dummy mask 50d. In an exemplary embodiment, the dummy pattern (60c in FIG. 8) may be removed while etching the first mask layer 50.

In exemplary embodiments, the first mask layer (50 in FIG. 8) may be anisotropically etched using a dry etching or dry cleaning, process to prevent the first mask layer 50 from remaining between the protrusions 62p of the conductive patterns 62.

Figure 9B:
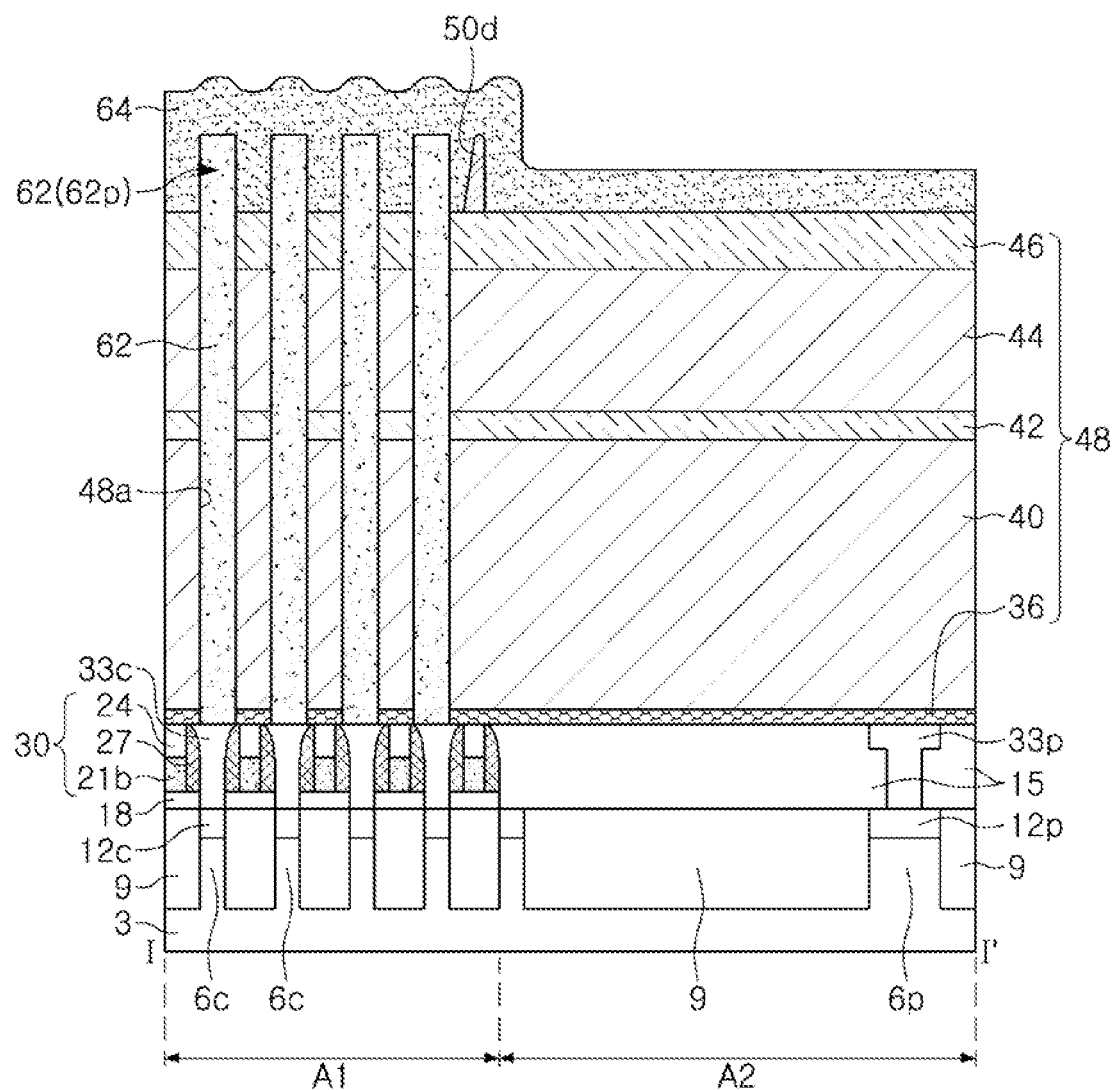
FIG. 9B is a cross-sectional view taken along line I-I' of FIG. 2 illustrating a semiconductor device which includes a capping material layer according to an exemplary embodiment of the present inventive concept.

In alternative exemplary embodiments, referring to FIGS. 1, 2, and 9B, a capping material layer 64 may be further formed to fill gaps between the protrusions 62p of the conductive patterns 62 and to cover the protrusions 62p and the mold structure 48. In an exemplary embodiment, the capping material layer 64 may be formed of a material that is different from a material of the upper support layer 46.

In one exemplary embodiment, the capping material layer 64 may be formed of the same material as the conductive patterns 62 and may be deposited by an atomic layer deposition (ALD) process. For example, in an exemplary embodiment in Which the conductive patterns 62 are formed of a conductive material such as TiN or the like, the capping material layer 64 may also be formed of this conductive material.

In another exemplary embodiment, the capping material layer 64 may be formed of a material that is different from the material of the conductive patterns 62. The material forming the capping material layer 69 may be deposited by an atomic layer deposition (ALD) process. For example, the capping material layer 64 may be formed of an oxide-based insulating material. However, the present inventive concept is not limited to the above materials, and the capping material layer 64 may be formed of various materials.

Referring to FIGS. 1, 2, 10A, and 10B, a chemical mechanical polishing (CMP) process may be performed using a planarization process apparatus 100 to expose the upper support layer 46. The protrusions 62p and the dummy mask 50d may also be removed by the CMP process to expose the upper support layer 46.

The planarization process apparatus 100 may include a polishing head 120, a polishing pad 115, a platen 110, a driving shaft 105, a driving means 125, and a slurry delivery arm 130. The polishing pad 115 may be attached to an upper portion of the platen 110, and the driving shaft 105 may be disposed on a lower portion of the platen 110 to rotate the polishing pad 115. The driving means 125 may be attached to an upper portion of the polishing head 120 and may be configured to move the polishing head in a direction perpendicular to a surface of the polishing head 120 and to rotate the polishing head 120.

In one exemplary embodiment as shown in FIG. 9A, a chemical mechanical polishing (CMP) process may be performed on a substrate 3 to which the protrusion 62p of the conductive patterns 62 are exposed. In one exemplary embodiment, the performing of the CMP process may include mounting the substrate 3, to which the protrusions 62p of the conductive patterns 62 are exposed, on a bottom surface of the polishing head 120, contacting the protrusions 62p of the conductive patterns 62 with the polishing pad 115, and chemically and/or mechanically polishing the protrusions of the conductive patterns until the upper support layer 46 is exposed. The polishing may be performed by respectively rotating the polishing pad and the polishing head while supplying a slurry 135 from the slurry delivery arm 130.

In another exemplary embodiment, a chemical mechanical polishing (CMP) process is performed on a substrate 3, on which the capping material layer 64 is formed to fill gaps between the protrusions 62p of the conductive patterns 62 and to fill the protrusions 62p, using the planarization process apparatus 100 in such a manner that the protrusions 62p of the conductive patterns 62 are removed to expose the upper support layer 46. In an exemplary embodiment, the performing of the CMP process may include mounting a substrate 3, on which the capping material layer 64 is formed, on a bottom surface of the polishing head 120, contacting the capping material layer 64 with the polishing pad 115, and chemically and/or mechanically polishing the capping material layer and the protrusions of the conductive patterns 62 of the substrate attached to the polishing head, until the upper support layer 46 is exposed. The polishing may be performed by respectively rotating the polishing pad and the polishing head while supplying a slurry 135 from the slurry delivery arm 130.

Figure 11:
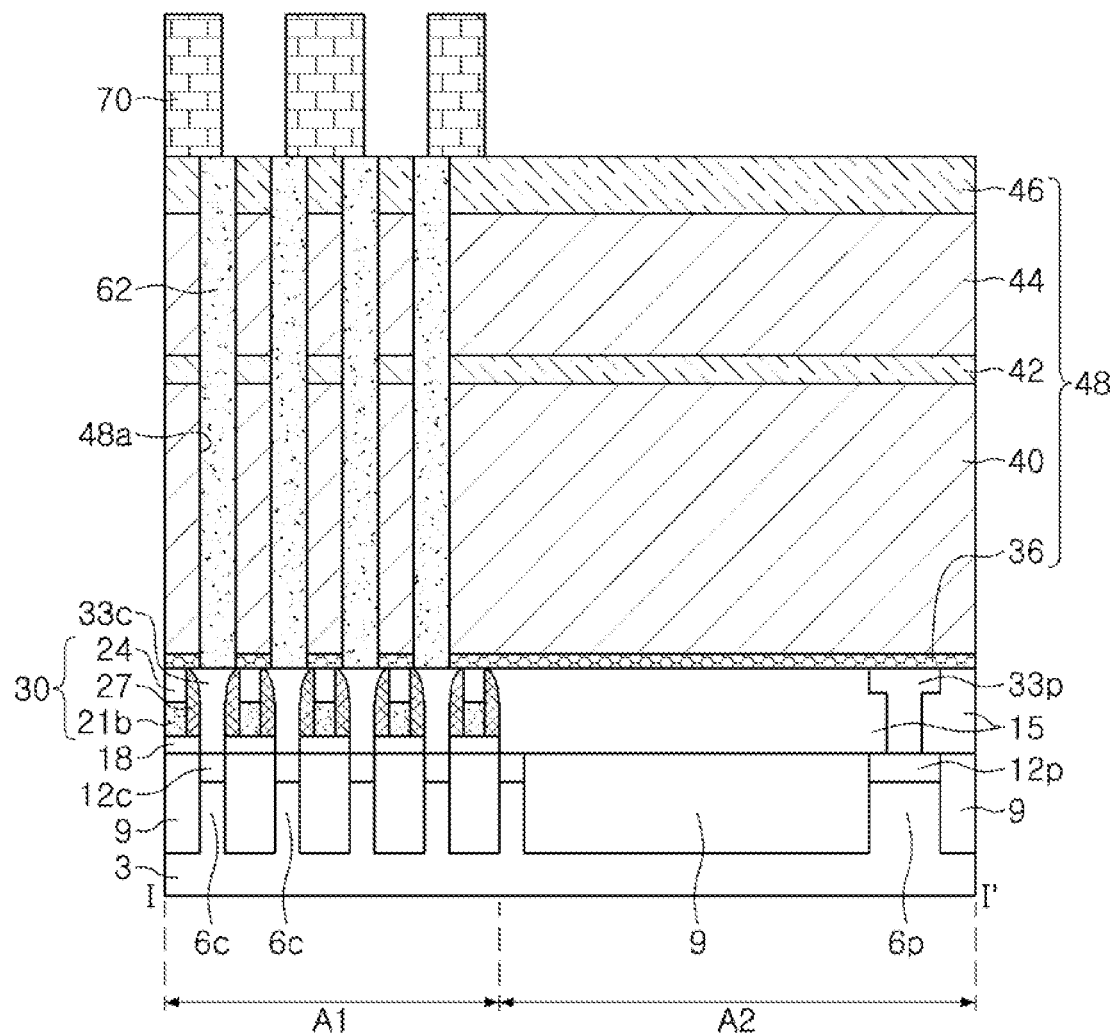

Referring to FIGS. 1, 2, and 11, in an exemplary embodiment, a mask 70 may be formed on the mold structure 48. The mask 70 may be a mask for forming support patterns. The mask 70 may cover a portion of the upper support layer 46 on the first region A1. Accordingly, the mask 70 may cover a portion of the upper support layer 46 and portions of conductive patterns 62 on the first region A1 while exposing the other portions.

Figure 12:
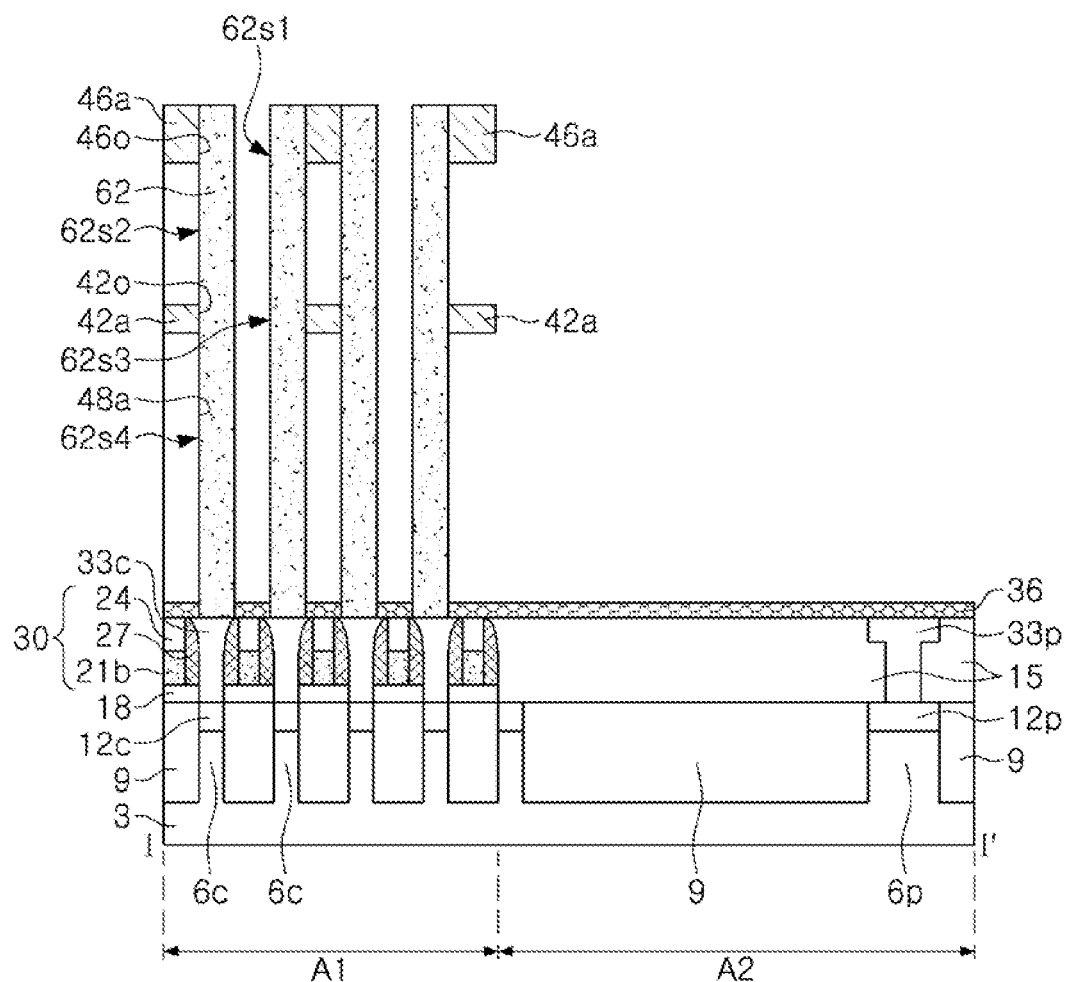

Referring to FIGS. 1, 2, and 12, the mold structure 48 may be patterned to form the single or plurality of support patterns connecting the conductive patterns 62, and the single or plurality of mold layers may be removed to expose side surfaces of the conductive patterns 62. The above-mentioned single or plurality of support layers may be patterned to be formed as a single or plurality of support patterns having openings. For example, an etching process may be performed using the mask 70 as an etching mask to etch the mold structure 48. In exemplary embodiments, the mask 70 may be removed after etching the mold structure 48 or while etching the mold structure 48. For example, the etching process may include etching the upper support layer 46 of the mold structure 48 using the mask 70 as an etching mask to form an upper support pattern 46a and to expose the upper mold layer 44. The etching process may further include etching the upper mold layer 44 to expose the lower support layer 42, etching the lower support layer 42 to form a lower support pattern 42a and to expose the lower mold layer 40, and etching the lower mold layer 40 to be removed.

In one exemplary embodiment, the etching process may include isotropically etching the upper mold layer 44 to be removed before etching the lower support layer 42.

In one exemplary embodiment, the etching process may include etching a portion of the upper mold layer 44 to expose the lower support layer 42 and isotropically etching the lower mold layer 40 to be removed and to remove a remaining portion of the upper mold layer 44.

In one exemplary embodiment, the etch stop layer 36 may remain even after the lower and upper mold layers 40 and 44 are removed.

In an exemplary embodiment, the conductive patterns 62 may have first side surfaces 62s1 exposed by an upper opening 46o of the upper support pattern 46a, second side surfaces 62s2 exposed by removing the upper mold layer 44, third side surfaces 62s3 exposed by a lower opening 42o of the lower support pattern 42a, and fourth side surfaces 62s4 exposed by removing the lower mold layer 40.

The lower and upper support patterns 42a and 46a may prevent defects such as leaning, bending or collapsing of the conductive patterns 62.

Figure 13:
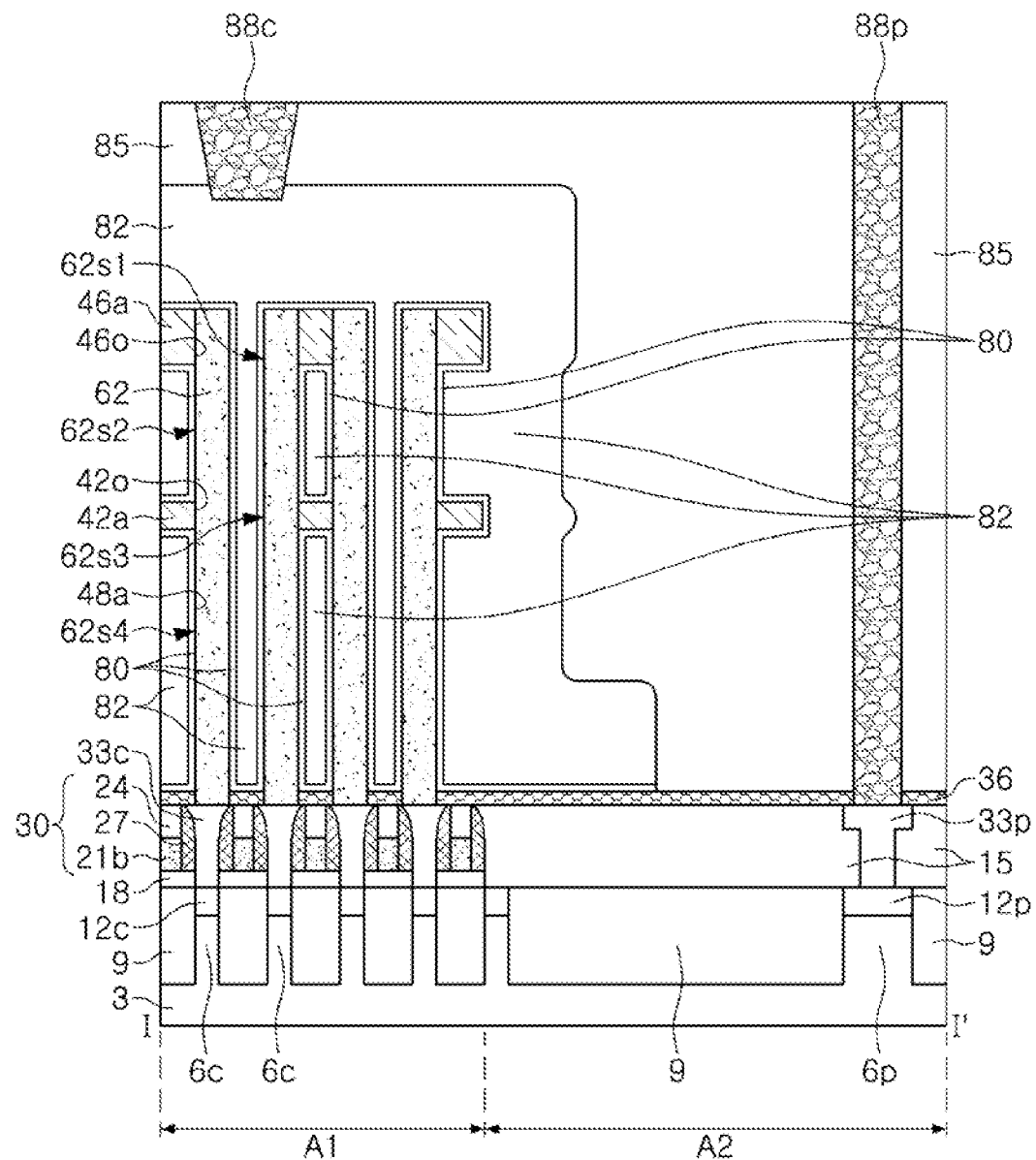

Referring to FIGS. 1, 2, and 13, a dielectric layer 80 may be conformally formed on a substrate 3 including the lower and upper support patterns 42a and 46a and the conductive patterns 62 having the exposed first to fourth side surfaces 62s1, 62s2, 62s3, and 62s4. An electrode layer 82 may be formed on the dielectric, layer 80 to fill gaps between the conductive patterns 62 and to cover the conductive patterns 62 and the lower and upper support patterns 42a and 46a.

The dielectric layer 80 may include a high-k dielectric, a silicon oxide, a silicon nitride, a silicon oxynitride, or combinations thereof. The electrode layer 80 may include a metal, a metal nitride, conductive carbon, a conductive semiconductor alloy, or combinations thereof. The semiconductor alloy may include a doped silicon-germanium (SiGe) material.

The electrode layer 82, the dielectric layer 80, and the conductive patterns 62 may constitute DRAM cell capacitors, storing information in a memory cell array, such as a DRAM, For example, the conductive patterns 62 may be bottom electrodes or storage nodes of DRAM cell capacitors. The electrode layer 82 may be top electrodes or plate electrodes thereof. Each of the conductive patterns 62 may be a first electrode. The electrode layer 82 may be a second electrode.

A planarized inter-metal insulating layer 85 may be formed on a substrate 3 including the electrode layer 82. A first contact structure 88c may be formed that penetrates the inter-metal insulating layer 85 and is electrically connected to the electrode layer 82. A second contact structure 88p may be harmed that penetrates the inter-metal insulating layer 85 and the etch stop layer 26 and is electrically connected to the peripheral contact plug 33p.

A semiconductor device (1 in FIG. 1) may be formed by the above-described method. Such a semiconductor device 1 may include the electrode layer 82, the dielectric layer 80, and the conductive patterns 62, constituting DRAM cell capacitors, as well as the lower and upper support patterns 42a and 46b. Each of the conductive patterns 62 (e.g., the bottom electrodes 62) may have a pillar shape extending in a direction perpendicular to a top surface of the substrate 3. The lower and upper support patterns 42a and 46b may prevent the pillar-shaped conductive patterns (e.g., the bottom electrodes 62) from leaning or being deformed.

Hereinafter, various modified examples of a method of forming a semiconductor device according to exemplary embodiments will be described. Hereinafter, a detailed description of cited elements will be omitted and modified parts of the cited components will mainly be described, while referring directly to the components described above.

Figure 14:
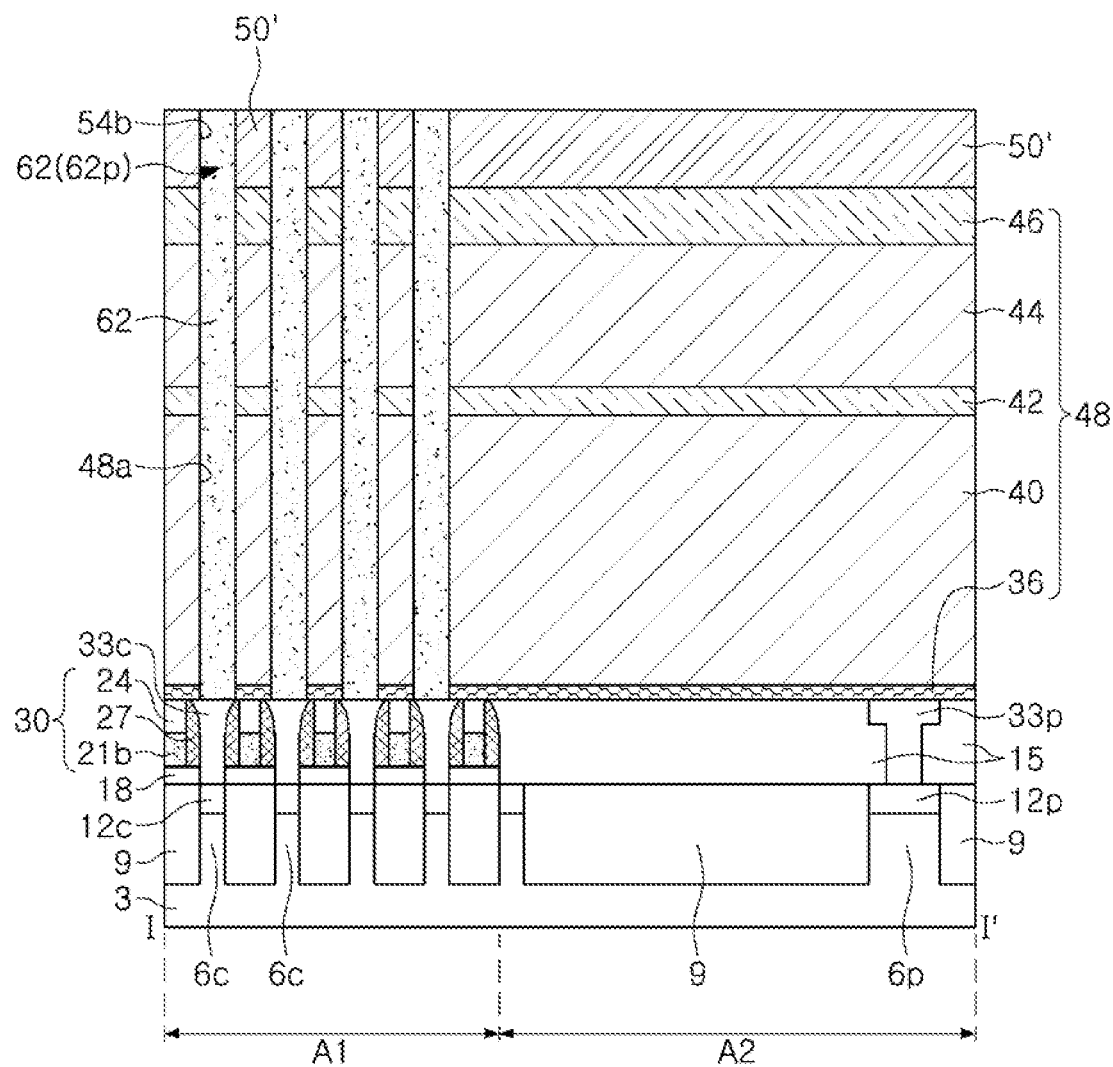
FIG. 14 is a cross-sectional view taken along line I-I' of FIG. 2 illustrating another exemplary embodiment of the present inventive concept.

With reference to FIG. 14, an alternative method of forming a semiconductor device according to an exemplary embodiment of the present inventive concept will be described.

Figure 10A:
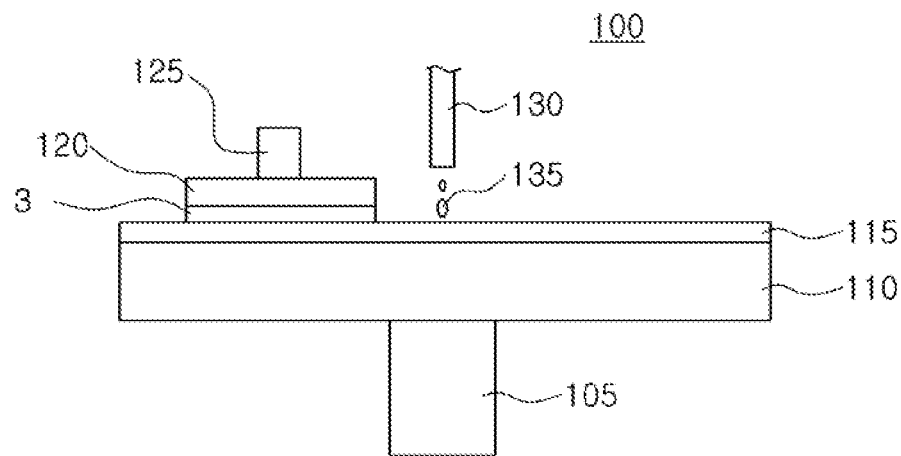
FIG. 10A is a sectional view illustrating a planarization device and process according to an exemplary embodiment of the present inventive concept.

Referring to FIGS. 1, 2, 10A, and 14, a substrate 3, on which elements are formed to the same conductive material layer 60 as described in FIG. 7, may be prepared. A chemical mechanical polishing (CMP) process may be performed on the substrate 3, on which elements are formed to the same conductive material layer 60 as described in FIG. 7, using the same planarization process apparatus 100 as illustrated in FIG. 10A. For example, the performing a CMP process may include mounting the substrate 3, on which elements are formed to the same conductive material layer 60 as described in FIG. 7, on a bottom surface of the polishing head 120, contacting the conductive material layer 60 with the polishing pad 115, and planarizing the conductive material layer 60 and the first mask layer 50 to form conductive patterns 62 and a planarized first mask layer 50'. The planarized first mask layer 50' may have substantially the same thickness on the first region A1 and the second region A2. The conductive patterns 62 may have protrusions 62p remaining in openings 54b of the planarized first mask layer 50'.

Figure 10B:
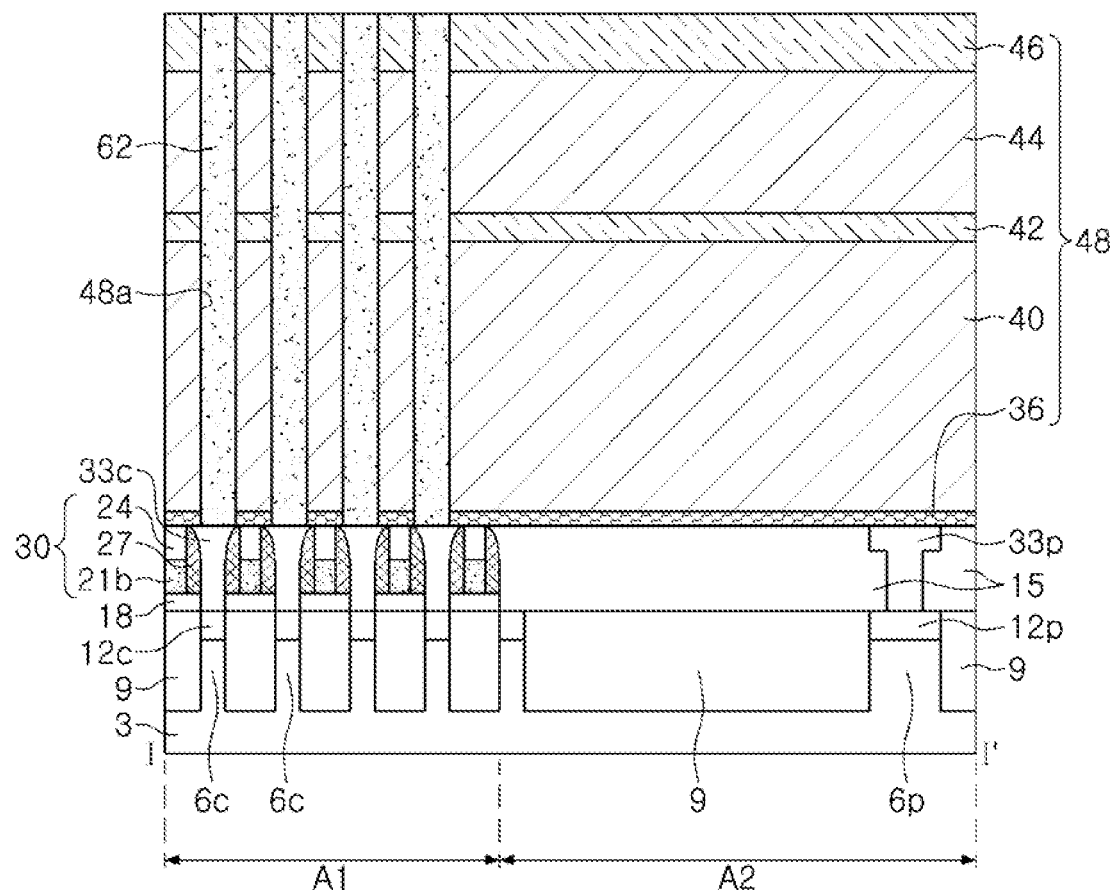

The planarized first mask layer 50' may be removed, and a planarization process may be performed in such a manner that the protrusions 62p of the conductive patterns 62 are removed to expose the upper support layer 46, similarly as illustrated in FIG. 10B.

After the upper support layer 46 is exposed, the processes described with reference to FIGS. 11 to 13 may be performed.

With reference to FIGS. 1, 2, and 11 and FIGS. 15A and 15B, another alternative example of a method of forming a semiconductor device according to an exemplary embodiment of the present inventive concept will be described.

Referring to FIGS. 1, 2, 11, 15A and 15B, a substrate 3, on which elements are formed to the mask 70 described in FIG. 11, may be prepared. The mask (70 in FIG. 11) may expose a portion of the upper support layer (46 in FIG. 11) and portions of upper surfaces of the conductive patterns (62 in FIG. 11).

The upper support layer (46 in FIG. 11) may be etched using the mask 70 as an etching mask to form an upper support pattern 46a. The upper insulating layer (44 in FIG. 11) may be etched and removed to expose the lower support layer (42 in FIG. 11) and the lower support layer (42 in FIG. 11) may be etched to form a lower support pattern 42a.

In one exemplary embodiment, portions of the conductive patterns 62, exposed by the mask 70 may be etched while the upper support layer (46 in FIG. 11) and the lower support layer (42 in FIG. 11O) are etched to form the upper support pattern 46a and the lower support pattern 42a.

Accordingly, the conductive patterns 62 may have first side surfaces 62s1' exposed by the upper opening 46o of the upper support pattern 46a, second side surfaces 62s2 exposed by removing the upper mold layer 44, and third side surfaces 62s3 exposed by a lower opening 42o of the lower support pattern 42a, similarly as described above. In an exemplary embodiment shown in FIG. 15A, the first side surfaces 62s1' of the conductive patterns 62 may be inclined. Then, the lower mold layer 40 and the mask layer 70 may be removed. Thus, the conductive patterns 62 may have fourth side surfaces 62s4 exposed by removing the lower mold layer 40.

Similarly as described with reference to FIG. 13, the dielectric layer 80, the electrode layer 82, the planarized inter-metal insulating layer 85, and the first and second contact structures 88c and 88p may be sequentially formed.

As a result, a semiconductor device (1 in FIG. 1) may be formed by the method of forming a semiconductor device described with reference to FIGS. 1, 2, 11, 15A and 15B. In such a semiconductor device 1, the conductive patterns 62' may be bottom electrodes of DRAM cell capacitors, as set forth above. The conductive patterns, for example, the bottom electrodes 62' may have upper surfaces coplanar with an upper surface of the upper support pattern 46a, and may have the first side surfaces in the openings 46o of the upper support pattern 46a, for example, the inclined side surfaces 62s1'.

Referring to FIGS. 1, 2, 7 and FIGS. 16A to 16B, a substrate 3, on which elements are formed to the same conductive materials layer (60 in FIG. 7) as illustrated in FIG. 7, may be prepared. The conductive material layer 60 may be etched to form conductive patterns 62' remaining in the holes 48a and the first mask openings 54b. Similarly as described above with reference to FIG. 8, in the conductive patterns 62', portions remaining in the first mask openings 54b may be referred to as protrusions 62p'. Additionally, as described above with reference to FIG. 8, the conductive material layer 60 may be etched to form the conductive patterns 62 while a portion of the conductive material layer 60 in contact with the second inclined portion 50cb may remain.

The conductive patterns 62' may have recessed regions 63 extending downwardly from central portions of upper surfaces of the conductive patterns 62'.

In exemplary embodiments, the recessed regions 63 of the conductive patterns 62' may extend to portions of the conductive patterns 62' surrounded by the upper mold layer 44 while passing through portions of the conductive patterns 62' surrounded by the mask portion 50a of the first mask layer 50 and the upper support layer 46.

Referring to FIGS. 1, 2, 7, and 16B, an additional material layer 66 may be formed on a substrate including the conductive patterns 62'. The additional material layer 66 may cover the conductive patterns 62' and the first mask layer 50 while filling the recessed regions 63 of the conductive patterns 62'.

In exemplary embodiments, the additional material layer 66 may be formed of the same material as the conductive patterns 62'. For example, in the case in which the conductive patterns 62' are formed of titanium nitride (TiN), the additional material layer 66 may also be formed of TiN.

However, the present inventive concept is not limited thereto, and the additional material layer 66 may be formed of a material that is different than the material of the conductive patterns 62'. For example, in the case in which the conductive patterns 62' is formed of TiN, the additional material layer 66 may be formed of a conductive material or an insulating material to fill the recessed regions 63. The present inventive concept is not limited to a type of material of the additional material layer 66, and the additional material layer 66 may include any material that may fill the recessed regions 63 of the conductive patterns 62'.

The additional material layer 66 may include gap-fill portions 66s which fill the recessed regions 63 and capping portions 66a, disposed on the conductive patterns 62', remaining in the first mask openings 54b of the first mask layer 50.

Figure 16A:
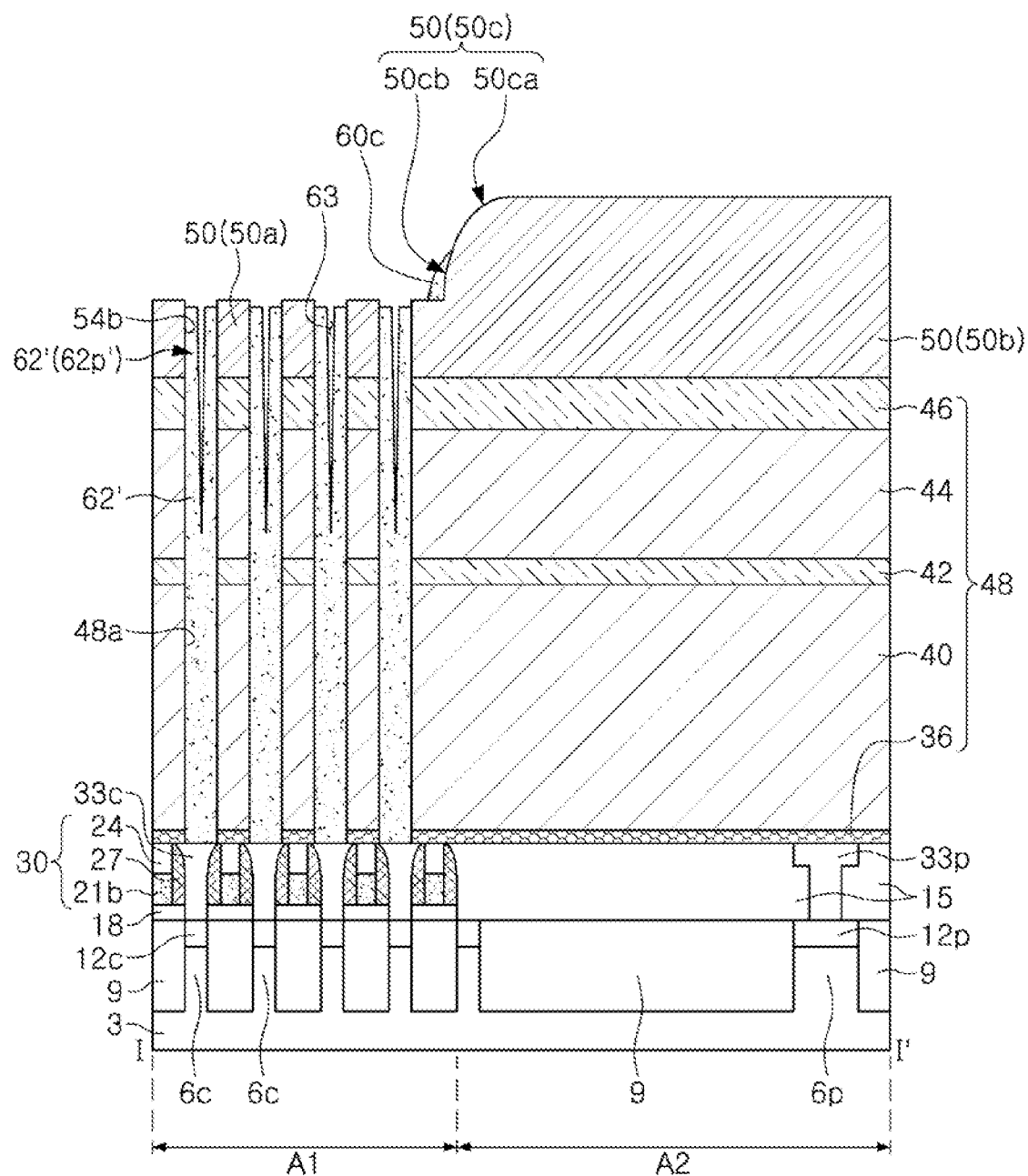
FIGS. 16A to 16D are cross-sectional views taken along line I-I' of FIG. 2 illustrating exemplary embodiments of the present inventive concept.
Figure 16B:
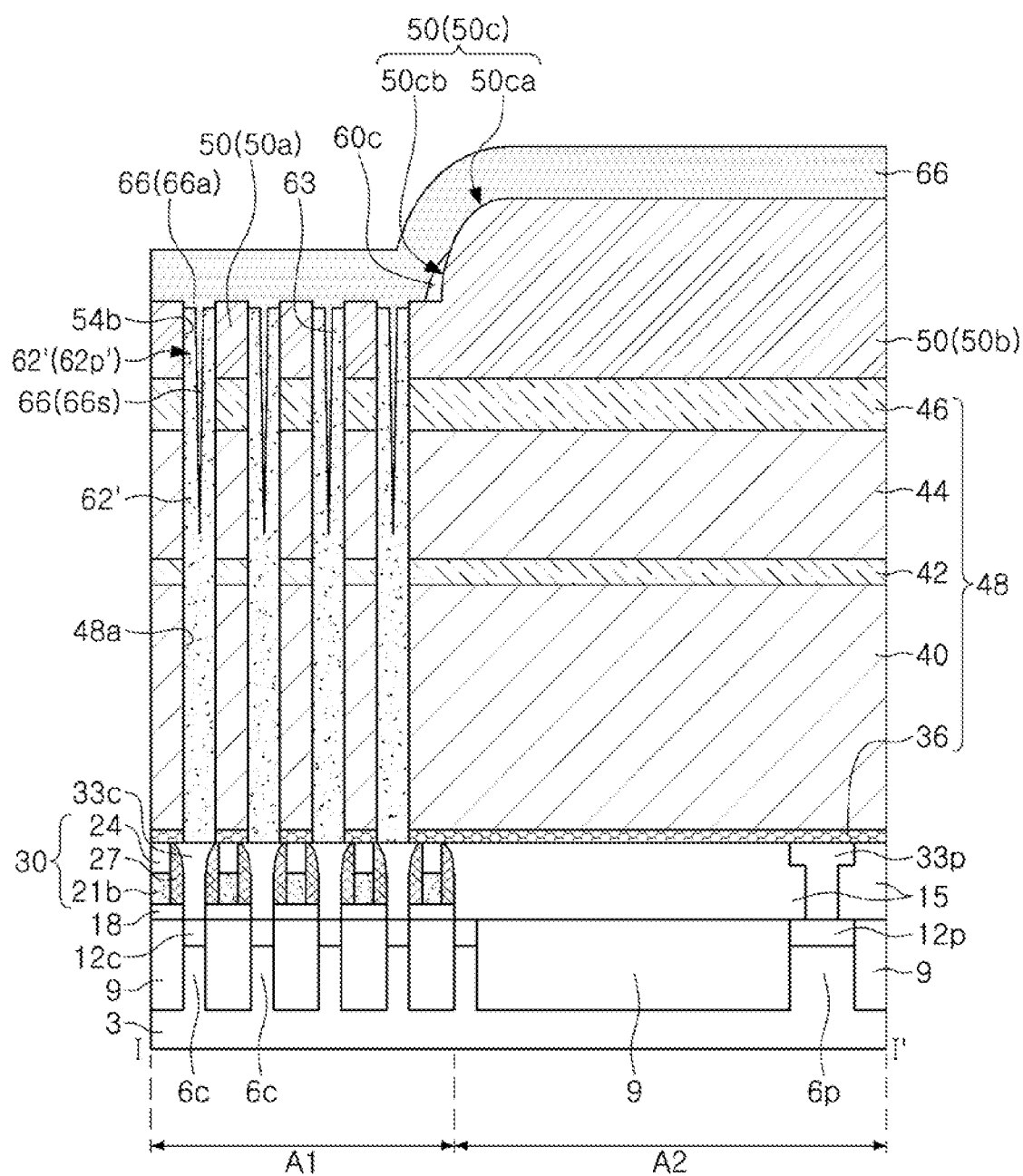
Figure 16C:
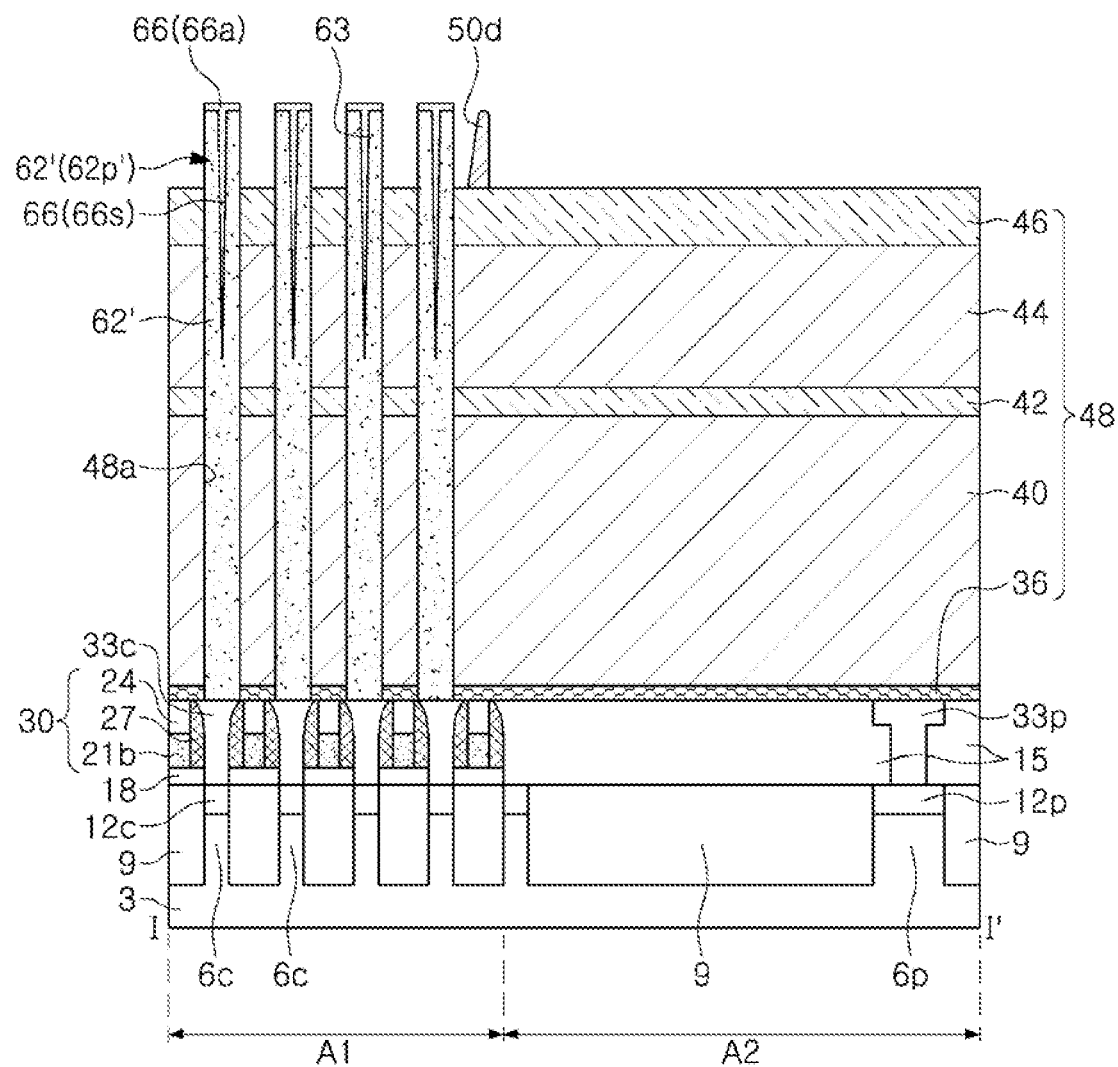
Figure 16D:
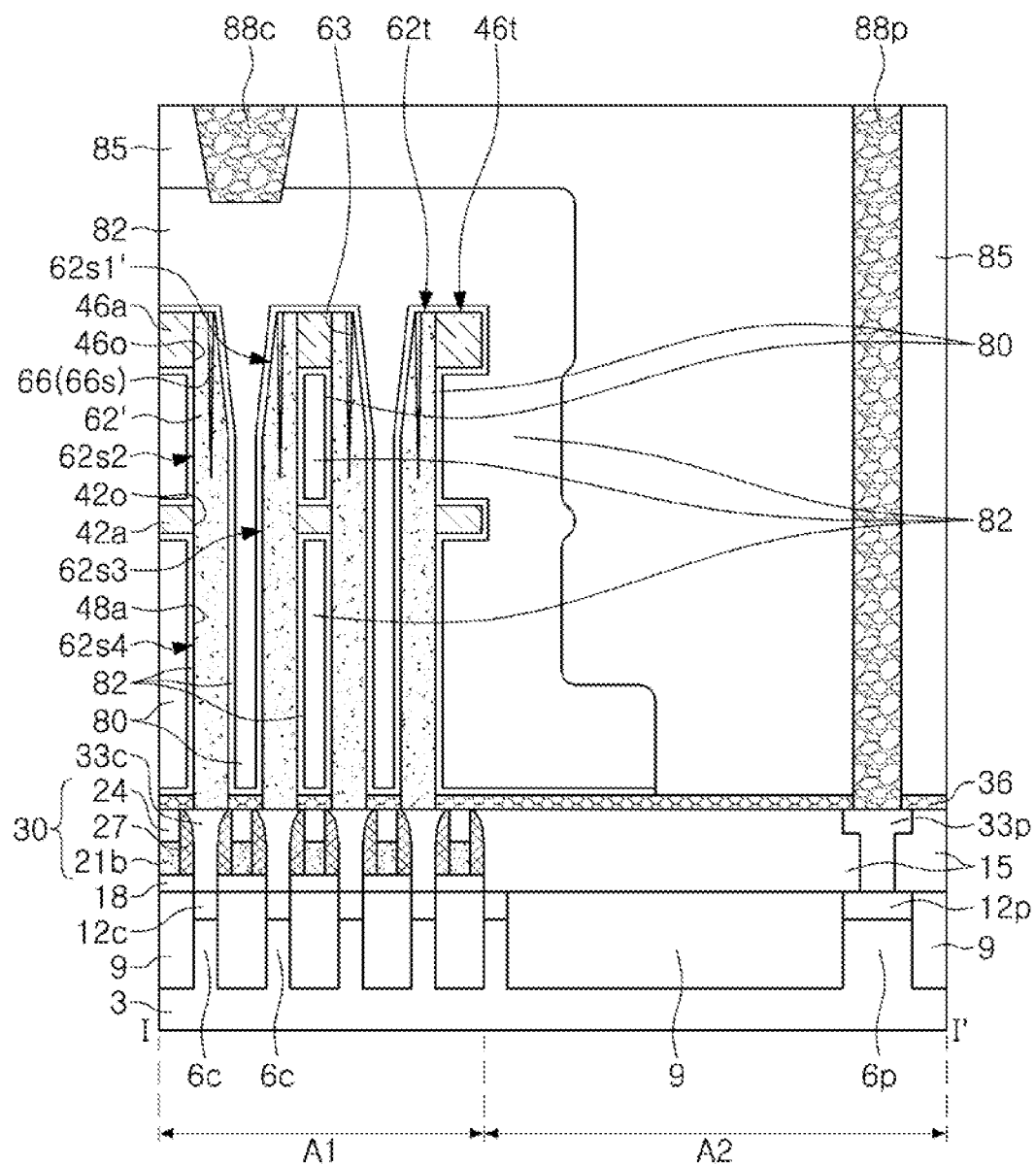

Referring to FIGS. 1, 7, and 16C, the additional material layer 66 disposed on the first mask layer 50 may be etched and removed.

In one embodiment, the gap-fill portions 66s of the additional material layer 66 of the recessed region 63 of the conductive patterns 62' may remain.

In another embodiment, the gap-fill portions 66s of the additional material layer 66 well as the capping portions 66a on the conductive patterns 62' may remain.

After the additional material layer 66 disposed on the first mask layer 50 is etched, the first mask layer 50 may be etched and removed, similarly as described in FIG. 9A. In one embodiment, the same dummy mask 50d as described in FIG. 9A may remain while etching the first mask layer 50.

Referring to FIGS. 1, 2, 7, and 16D, a chemical mechanical polishing (CMP) process is performed using the same planarization process apparatus 100 as described in FIGS. 10A and 10B in such a manner that the protrusions 62p' of the conductive patterns 62' may be removed to expose the upper support layer 46.

The gap-fill portions 66s remaining in the conductive patterns 62' may prevent the protrusion 62p' of the conductive patterns 62' from being broken to damage the conductive patterns 62' during the CMP process using the planarization process apparatus 100.

Figure 15A:
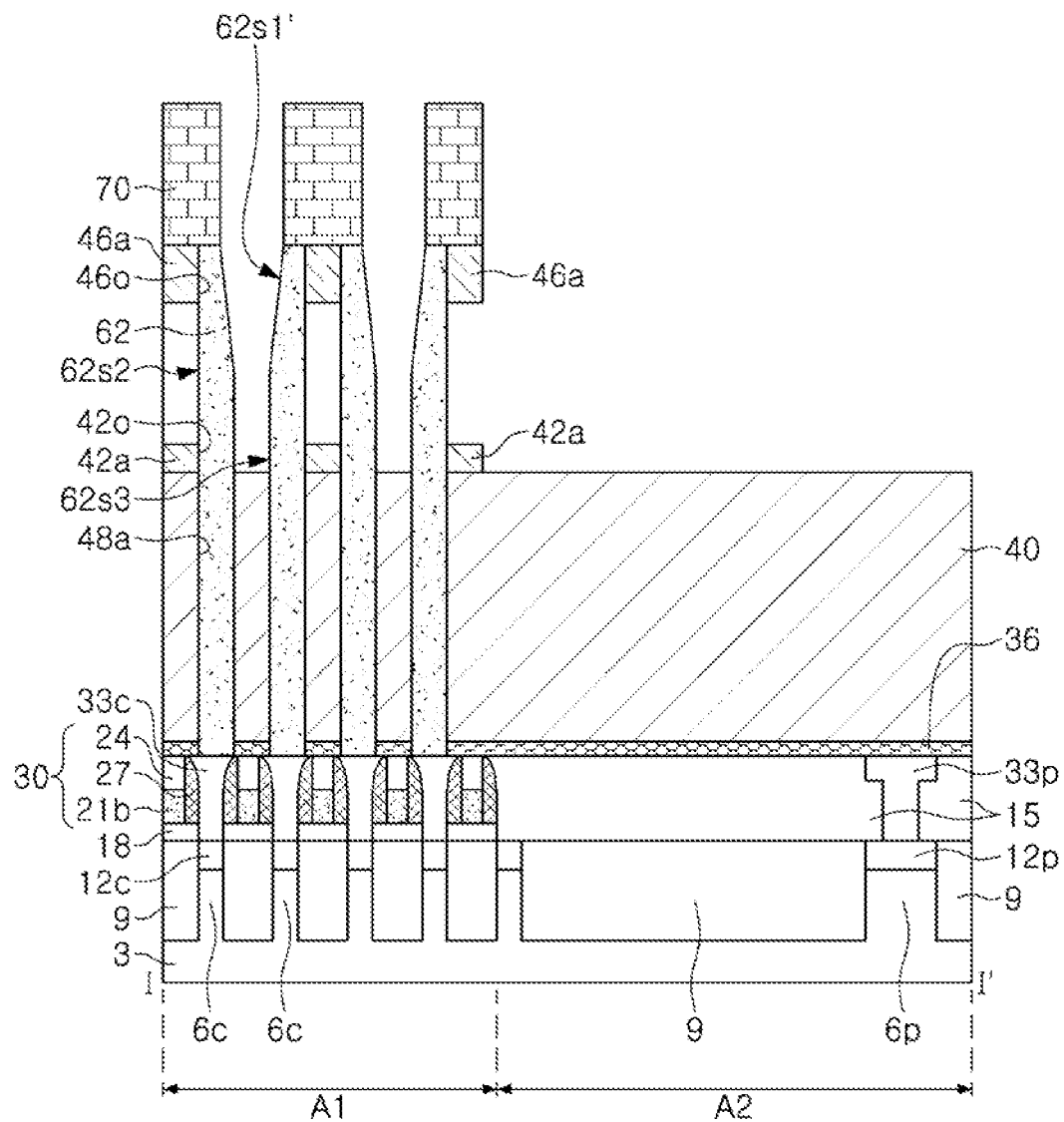
FIGS. 15A and 15B are cross-sectional views taken along line I-I' of FIG. 2 illustrating exemplary embodiments of the present inventive concept.
Figure 15B:
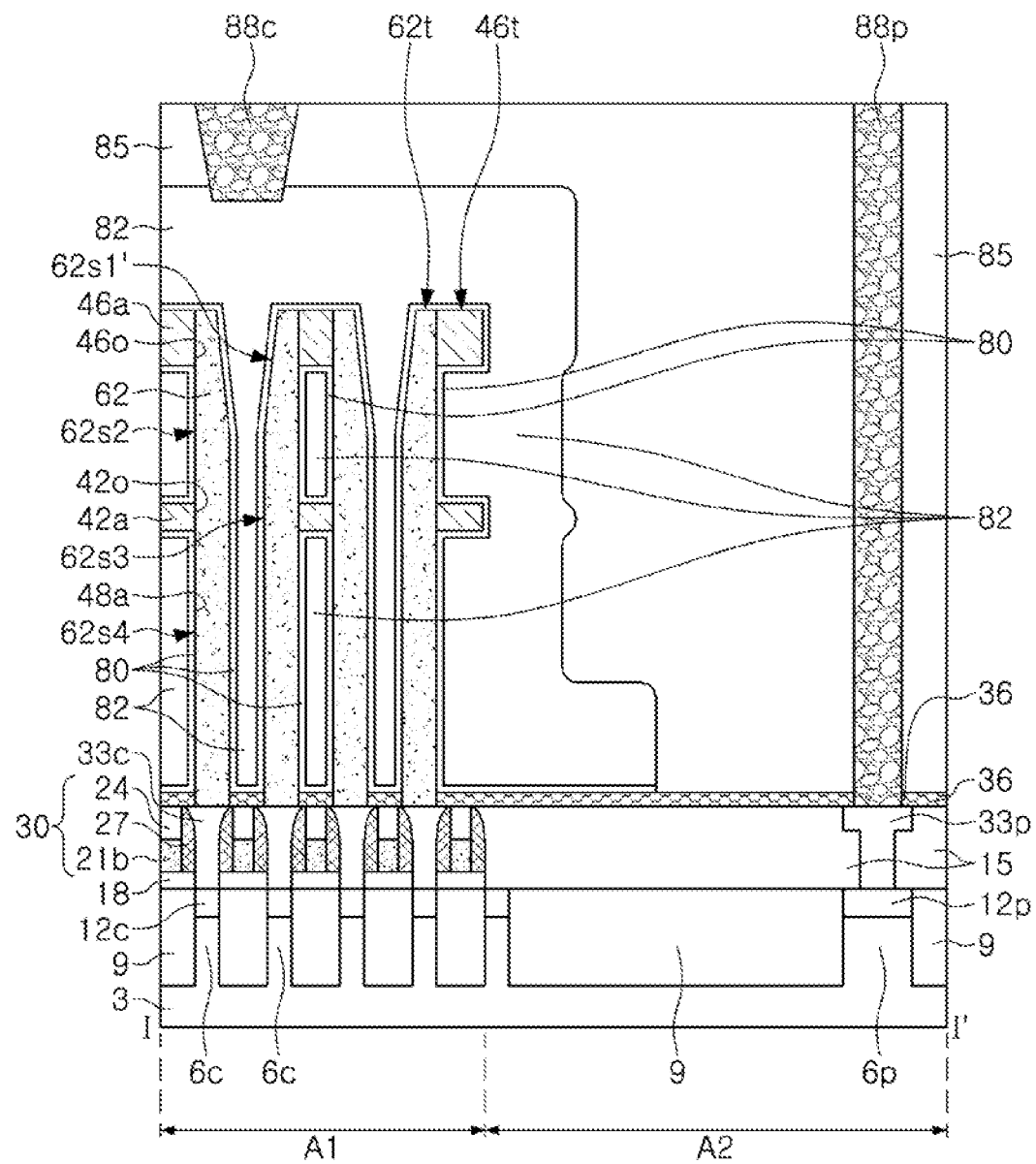

Similarly as described with reference to FIGS. 15A and 15B, the mask (70 in FIG. 15A) may be formed and a process described with reference to FIGS. 15A and 15B may be performed. Accordingly, as described above, the upper support layer (46 in FIG. 16C) may be formed as an upper support pattern 46a, the lower support layer (42 in FIG. 16C) may be formed as a lower support pattern 42a, and the upper and lower mold layers (40 and 44 in FIG. 16C) may be removed. Similarly as described with reference to FIGS. 15a and 15B, the dielectric layer 80, the electrode layer 82, the planarized inter-metal insulating layer 85, and the first and second contact structures 88c and 88p may be sequentially formed.

Accordingly, a semiconductor device (1 in FIG. 1) may be formed by the method of forming a semiconductor device described with reference to FIGS. 1, 2, 7 and 16A to 16D. In such a semiconductor device 1, each of the conductive patterns 62' may be a bottom electrode of a DRAM cell capacitor, as described above, and may include the recessed region 63 extending downwardly from an upper surface of each of the conductive patterns 62'. As set forth above, the semiconductor device 1 may include the gap-fill portions 66s disposed in the recessed regions 63.

In exemplary embodiments, as described above, a mask structure 54 including the first and second mask layers 50 and 52 for patterning the mold structure 48 may be provided to reliably and stably form holes (48a in FIG. 6) which may penetrate the mold structure 48 even as the height of the mold structure 48 is increased.

In exemplary embodiments, after formation of the first mask layer 50 including the first and second mask portions 50a and 50b having heights different from each other, the first mask layer 50 may be removed, and the protrusions 62p of the conductive patterns 62 may be removed using the CMP process in such a manner that upper surfaces of the conductive patterns 62, where the protrusion 62p are removed, may be disposed on the same plane as an upper surface of the upper support layer 46. Accordingly, since the conductive patterns 62 may be used as bottom electrodes of DRAM cell capacitors, the capacitors do not need to have a decreased height which would lead to a decrease in capacitance.

According to embodiments of the present inventive concept, a method of forming a semiconductor device may be provided to reliably and stably form bottom electrodes of DRAM cell capacitors. Since the bottom electrodes may be reliably and stably formed, reliability of the DRAM cell capacitors may be improved. Thus, reliability of a semiconductor device may be improved.

While exemplary embodiments have been shown and described above, it will be apparent to those skilled in the art that modifications and variations could be made without departing from the scope of the present inventive concept as defined by the appended claims.

What is claimed is:

1. A method of forming a semiconductor device, comprising:
   forming a mold structure on a substrate;
   forming a first mask layer having a deposition thickness on the mold structure;
   patterning the first mask layer to form first mask openings that expose the mold structure;
   etching the mold structure exposed by the first mask openings to form holes that penetrate the mold structure, wherein the first mask layer is thinned to form mask portions having thickness smaller than the deposition thickness;
   forming conductive patterns that fill the holes and the first mask openings;
   etching the first mask layer including the mask portions to expose the mold structure, the conductive patterns having protrusions; and
   performing a chemical mechanical polishing process to remove the protrusions of the conductive patterns.

2. The method of claim 1, wherein the patterning the first mask layer comprises:
   forming a second mask layer on the first mask layer, the second mask layer having second mask openings exposing the first mask layer on the first mask layer; and
   etching the first mask layer exposed by the second mask openings to form the first mask openings,
   wherein the second mask layer is removed before the first mask layer is thinned to have a thickness less than the deposition thickness.

3. The method of claim 1, further comprising:
   forming a capping material layer to fill gaps between the protrusions of the conductive patterns and to cover the mold structure prior to performing the chemical mechanical polishing process,
   wherein the chemical mechanical polishing process includes removing the protrusions of the conductive patterns together with the capping material layer.

4. The method of claim 1, wherein the mold structure includes a lower mold layer, a lower support layer disposed on the lower mold layer, an upper mold layer disposed on the lower support layer, and an upper support layer disposed on the upper mold layer, and
   the protrusions are removed using the chemical mechanical polishing process to expose the upper support layer.

5. The method of claim 4, further comprising:
   patterning the mold structure to form an upper support pattern and a lower support pattern and to remove the upper and lower mold layers, the upper support layer being patterned to form the upper support pattern that is configured to connect the conductive patterns, and the lower support layer being patterned to form the lower support pattern that is configured to connect the conductive patterns,
   forming a dielectric layer to conformally cover the conductive patterns and the lower and upper support patterns after patterning the mold structure; and
   forming an electrode layer on the dielectric layer.

6. The method of claim 5, wherein a portion of the conductive patterns is etched while patterning the upper support layer to form an inclined side surface.

7. The method of claim 1, wherein the forming conductive patterns comprises:
   forming a conductive material layer that fills the holes and the first mask openings and covers the first mask layer; and
   performing a planarizing chemical mechanical polishing process to expose the mask portions.

8. The method of claim 1, further comprising:
   forming an additional material layer on the first mask layer and the conductive patterns after the conductive patterns are formed; and
   etching the additional material layer,
   wherein each of the conductive patterns has a region recessed from a central portion of an upper surface thereof,
   the additional material layer includes gap-fill portions disposed to fill the recessed regions of the conductive patterns, and the gap-fill portions of the additional material layer remain in the recessed regions after the chemical mechanical polishing process is performed to remove the protrusions of the conductive patterns.

9. A method of forming a semiconductor device, comprising:
    forming a mold structure on a substrate;
    forming a mask layer on the mold structure, the mask layer having mask openings to expose the mold structure;
    etching the mold structure to form holes therein;
    forming a conductive material layer to fill the holes and the mask openings and to cover the mask layer;
    etching the conductive material layer to form conductive patterns in the holes and the mask openings;
    etching the mask layer to expose side surfaces of protrusions of the conductive patterns; and
    performing a chemical mechanical polishing process to remove the protrusions of the conductive patterns.

10. The method of claim 9, further comprising:
    forming a capping material layer to fill gaps between the protrusions of the conductive patterns and to cover the mold structure prior to the performance of the chemical mechanical polishing process, and
    removing the protrusions of the conductive patterns together with the capping material layer in the chemical mechanical polishing process.

11. The method of claim 9, wherein the mask layer after formation of the holes includes a first mask portion, a second mask portion and an inclined portion between the first mask portion and the second mask portion,
    wherein a second thickness of the second mask portion is greater than a first thickness of the first mask portion, and
    wherein the inclined portion includes a first inclined portion positioned adjacent to the second mask portion and a second inclined portion, having a slope that is greater than a slope of the first inclined portion, the second inclined portion being positioned adjacent to the first mask portion.

12. The method of claim 11, further comprising:
    etching the conductive material layer to form the conductive patterns while a portion of the conductive material layer remains as a dummy pattern in contact with the second inclined portion.

13. The method of claim 12, further comprising:
    etching the mask layer to expose the protrusions of the conductive patterns while a portion of the mask layer remains below the dummy pattern to be formed as a dummy mask.

14. The method of claim 13, wherein the dummy pattern is removed while the dummy mask is formed, and
    the dummy mask is removed while the chemical mechanical polishing process is performed to remove the protrusions of the conductive patterns.

15. The method of claim 9, wherein the mold structure includes a single or a plurality of mold layers and a single or a plurality of support layers, and
    the single or the plurality of support layers include an uppermost support layer that is exposed after the chemical mechanical polishing process is performed.

16. A method of forming a semiconductor device, comprising:
    forming a mold structure including at least one mold layer and at least one support layer, wherein a first support layer is disposed on an uppermost portion of the mold structure;
    forming a mask layer having mask openings on the mold structure, the mask openings exposing the mold structure;
    etching the mold structure exposed by the mask openings to form holes that penetrate the mold structure, the mask layer being formed to include a first mask portion having a first thickness and a second mask portion having a second thickness that is greater than the first thickness, wherein the mask openings remain in the first mask portion after the etching is performed;
    forming conductive patterns in the holes and the mask openings, the conductive patterns including protrusions;
    etching the mask layer to expose the conductive patterns including protrusions;
    performing a chemical mechanical polishing process to remove the protrusions of the conductive patterns;
    patterning the mold structure, the at least one support layer being patterned to be formed as at least one support patterns having opening, and the at least one mold layer being removed to expose side surfaces of the conductive patterns;
    forming a dielectric layer on the at least one support patterns and the conductive patterns; and
    forming an electrode layer on the dielectric layer.

* * * * *